(12) United States Patent
Bommer et al.

(10) Patent No.: US 9,015,018 B2
(45) Date of Patent: Apr. 21, 2015

(54) BOUNDARY SYSTEM DESIGNER FOR WIRELESS AIRCRAFT NETWORKS

(75) Inventors: Jason Philip Bommer, Tacoma, WA (US); Keith J. Glover, Kent, WA (US)

(73) Assignee: The Boeing Company, Chicago, IL (US)

( * ) Notice: Subject to any disclaimer, the term of this patent is extended or adjusted under 35 U.S.C. 154(b) by 524 days.

(21) Appl. No.: 13/424,885

(22) Filed: Mar. 20, 2012

(65) Prior Publication Data

US 2013/0253887 A1 Sep. 26, 2013

(51) Int. Cl.
*H04W 16/18* (2009.01)
*H04W 16/20* (2009.01)
*G06F 17/50* (2006.01)

(52) U.S. Cl.
CPC ........... *H04W 16/18* (2013.01); *B64C 2211/00* (2013.01); *H04W 16/20* (2013.01); *G06F 17/5095* (2013.01)

(58) Field of Classification Search
CPC ........ G21F 7/00; G06F 17/5095; H04W 4/04; H04W 16/18; H04W 16/20
USPC ............................................................. 703/8
See application file for complete search history.

(56) References Cited

U.S. PATENT DOCUMENTS

| | | | | |
|---|---|---|---|---|
| 5,646,761 | A * | 7/1997 | Medved et al. ............... | 398/123 |
| 6,442,507 | B1 * | 8/2002 | Skidmore et al. ............. | 702/186 |
| 7,113,779 | B1 * | 9/2006 | Fujisaki ........................ | 455/431 |
| 7,483,696 | B1 * | 1/2009 | Mitchell ....................... | 455/431 |
| 7,496,361 | B1 * | 2/2009 | Mitchell et al. ............... | 455/423 |
| 7,502,712 | B2 * | 3/2009 | Mateo Martinez ........... | 702/179 |
| 7,505,445 | B2 * | 3/2009 | Pirila et al. ................... | 370/338 |
| 7,680,454 | B2 * | 3/2010 | Mori et al. ................... | 455/41.2 |
| 8,026,857 | B2 | 9/2011 | Bommer | |
| 8,060,345 | B2 * | 11/2011 | Lee et al. ........................ | 703/1 |
| 8,170,843 | B2 * | 5/2012 | Lee ................................ | 703/2 |
| 8,340,067 | B2 * | 12/2012 | Buga et al. .................... | 370/338 |
| 8,750,708 | B2 * | 6/2014 | Fuss et al. ..................... | 398/115 |
| 2003/0014223 | A1 * | 1/2003 | Phillips et al. .................... | 703/1 |
| 2004/0143428 | A1 | 7/2004 | Rappaport et al. | |

(Continued)

FOREIGN PATENT DOCUMENTS

| | | |
|---|---|---|
| EP | 1478106 A2 | 11/2004 |
| EP | 2048637 A | 4/2009 |
| WO | WO02073473 A1 | 9/2002 |

OTHER PUBLICATIONS

EP search report dated Jun. 14, 2013 regarding application 13157948.4-1854, reference 1284P506EP ML, applicant The Boeing Company.

*Primary Examiner* — Akash Saxena
(74) *Attorney, Agent, or Firm* — Yee & Associates, P.C.

(57) ABSTRACT

An aircraft design system comprising a components database having designs for components configured for use in an aircraft, a materials database having materials selected for desired types of wireless signal propagation, and a boundary designer. The boundary designer is configured to identify a configuration for wireless networks in the aircraft. The boundary designer is further configured to select a number of boundaries for the wireless networks that provide a desired propagation of wireless signals for the wireless networks. The boundary designer is further configured to select a configuration for a number of the components from the designs in the components database and select a number of materials for the number of the components to form the number of boundaries for the wireless networks.

20 Claims, 14 Drawing Sheets

(56) References Cited

U.S. PATENT DOCUMENTS

| | | |
|---|---|---|
| 2004/0259554 A1 | 12/2004 | Rappaport et al. |
| 2005/0251520 A1* | 11/2005 | Vidov et al. ............ 707/100 |
| 2006/0221895 A1* | 10/2006 | Mori et al. ............ 370/328 |
| 2007/0233433 A1 | 10/2007 | Lee et al. |
| 2008/0004016 A1* | 1/2008 | Smee et al. ............ 455/435.1 |
| 2008/0164997 A1* | 7/2008 | Aritsuka et al. ........ 340/539.13 |
| 2010/0148002 A1* | 6/2010 | Park et al. ............ 244/118.5 |
| 2010/0231340 A1* | 9/2010 | Fiorello et al. ............ 336/92 |
| 2010/0274545 A1* | 10/2010 | Greenberg et al. ............ 703/8 |
| 2011/0044206 A1* | 2/2011 | Kalika et al. ............ 370/254 |
| 2011/0092152 A1* | 4/2011 | Lee et al. ............ 455/1 |
| 2011/0188862 A1* | 8/2011 | Fuss et al. ............ 398/115 |
| 2012/0303336 A1* | 11/2012 | Becker et al. ............ 703/1 |
| 2013/0139598 A1* | 6/2013 | Sohn et al. ............ 73/597 |
| 2013/0158955 A1* | 6/2013 | Song et al. ............ 703/1 |
| 2013/0253887 A1* | 9/2013 | Bommer et al. ............ 703/1 |
| 2013/0288645 A1* | 10/2013 | Zheng ............ 455/411 |
| 2013/0304426 A1* | 11/2013 | Sciarra et al. ............ 703/1 |
| 2014/0036686 A1* | 2/2014 | Bommer et al. ............ 370/241 |

* cited by examiner

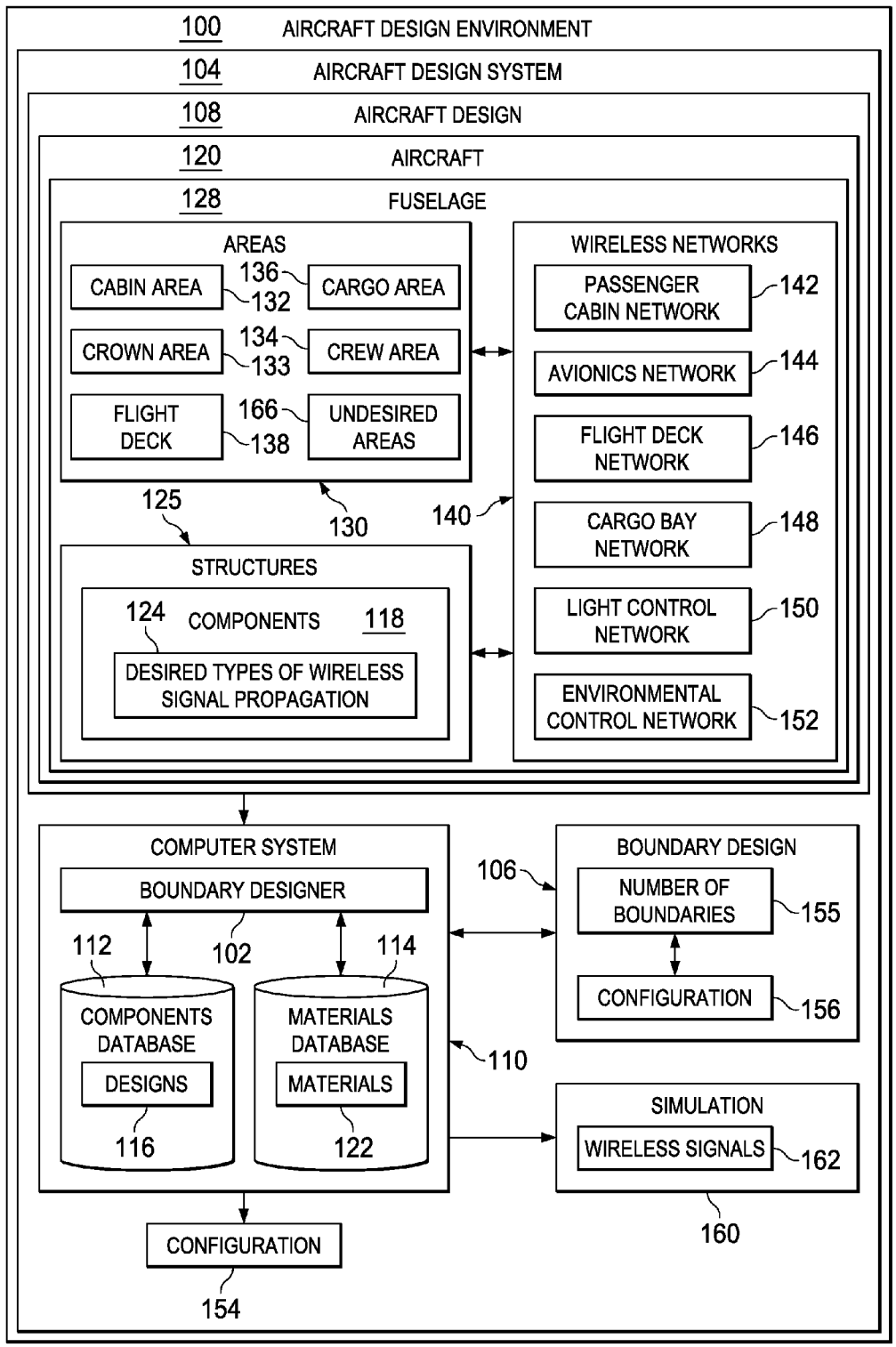

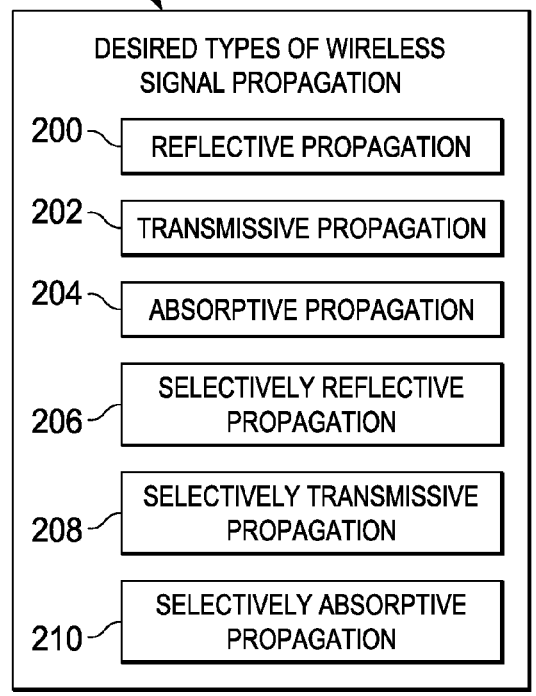
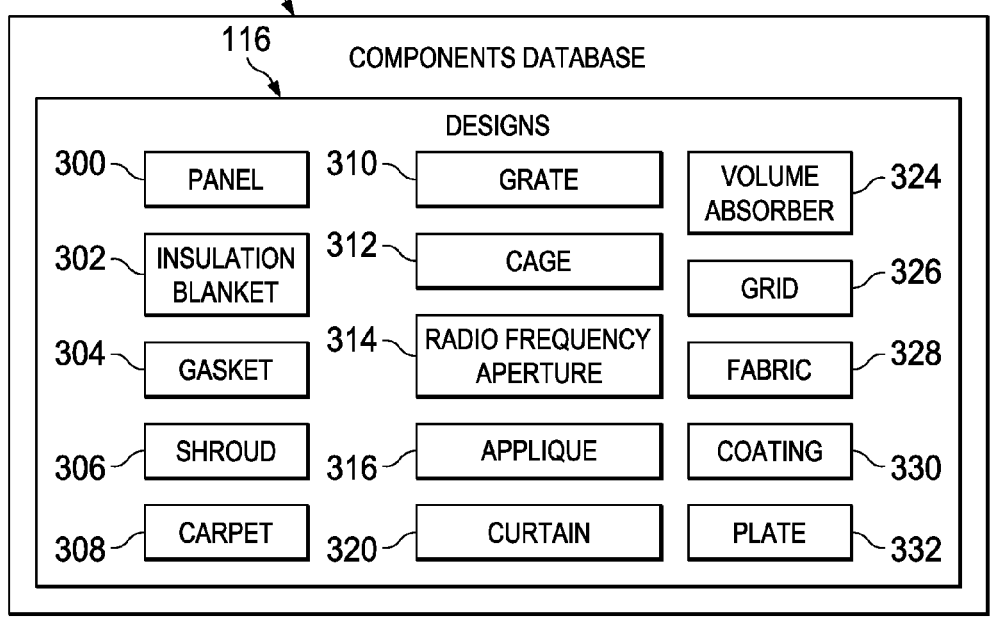

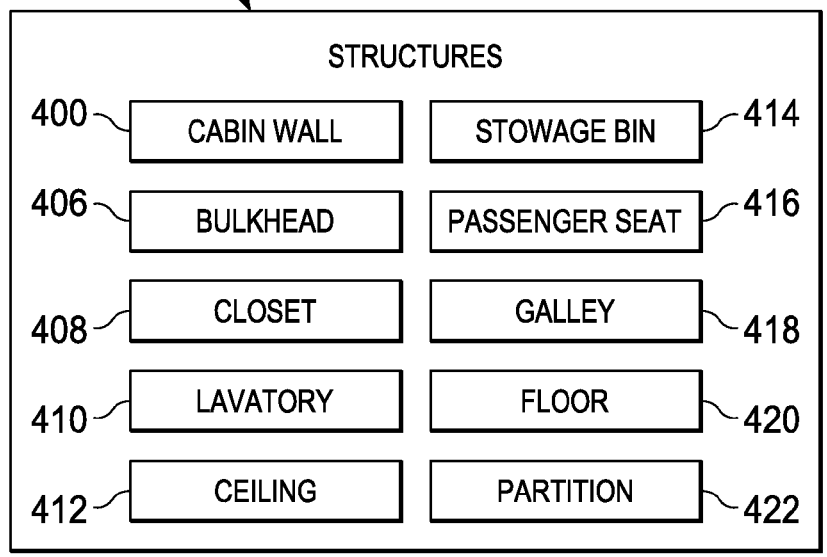
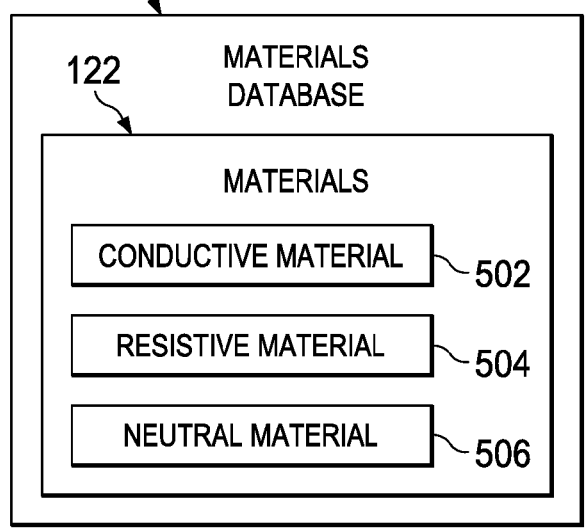

FIG. 14
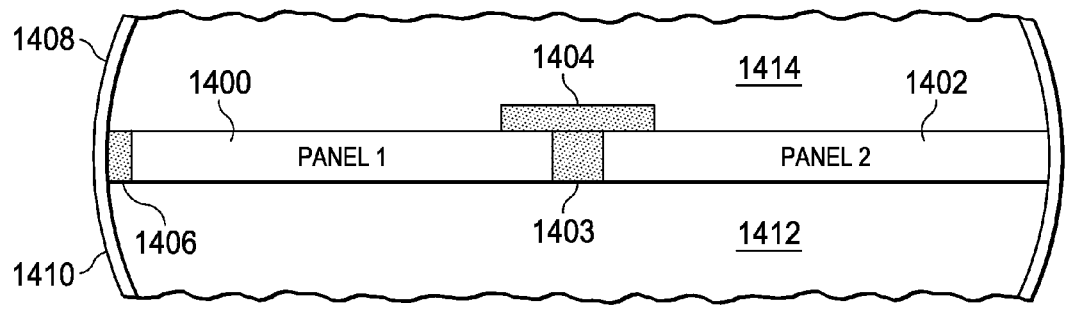
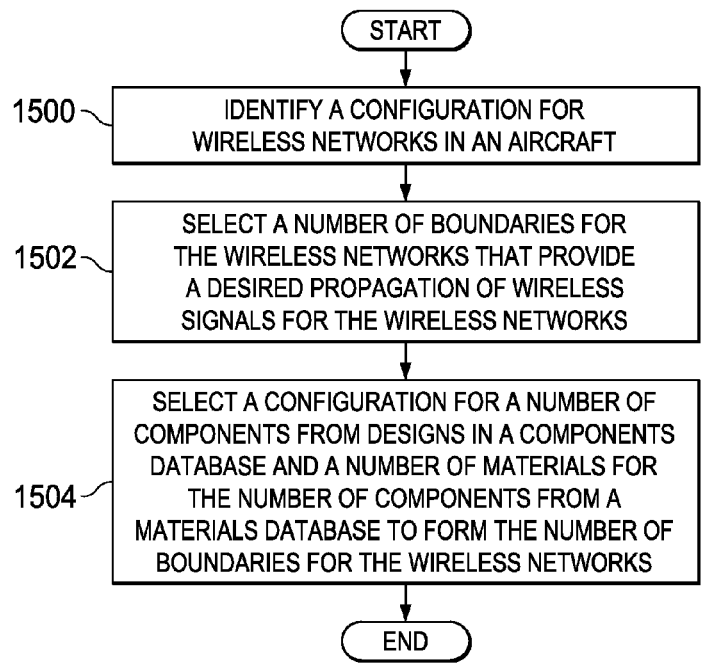
FIG. 15

BOUNDARY SYSTEM DESIGNER FOR WIRELESS AIRCRAFT NETWORKS

BACKGROUND INFORMATION

1. Field

The present disclosure relates generally to aircraft and, in particular, to designing aircraft. Still more particularly, the present disclosure relates to a method and apparatus for designing boundaries for wireless networks in the interior of an aircraft.

2. Background

In designing and manufacturing aircraft, reducing the weight of the aircraft is desirable. The reduction in weight often provides savings in fuel and other costs. Wiring between different devices may add more weight than desired. As a result, wireless networks have been introduced into aircraft for different systems.

For example, a wireless network may be implemented to send data from different sensors to a computer system. The sensors in the wireless network include air pressure sensors, temperature sensors, position sensors for actuators, and other suitable types of sensors.

Another wireless network may be present in the aircraft to control lighting in the aircraft. Further, another wireless network may include devices for an environmental system of the aircraft. A network of wireless access points may be present in or around the cabin of an aircraft for use by passengers to access the Internet. These and other types of wireless networks may reduce the amount of wiring needed in the aircraft.

The performance of multiple wireless networks in an aircraft, however, may not be as desired. For example, when more than one wireless network is present in the aircraft, the wireless signals transmitted by the wireless networks may interfere with each other and reduce the amount of performance desired. The interference may reduce the reliability, reduce distances for wireless signal propagation, or cause other undesired effects. As a result, additional wireless devices may be added to take into account reduced performance. The addition of devices, however, may increase the weight of the aircraft more than desired.

Therefore, it would be desirable to have a method and apparatus that takes into account at least some of the issues discussed above as well as possibly other issues.

SUMMARY

In one illustrative embodiment, an aircraft design system comprises a components database having designs for components configured for use in an aircraft, a materials database having materials selected for desired types of wireless signal propagation, and a boundary designer. The boundary designer is configured to identify a configuration for wireless networks in the aircraft. The boundary designer is further configured to select a number of boundaries for the wireless networks that provide a desired propagation of wireless signals for the wireless networks. The boundary designer is further configured to select a configuration for a number of the components from the designs in the components database and select a number of materials for the number of the components to form the number of boundaries for the wireless networks.

In another illustrative embodiment, a method for designing an aircraft is present to provide an optimized wireless signal propagation channel. A number of boundaries for the wireless networks is selected that provide a desired propagation of wireless signals for the wireless networks. A configuration is selected for a number of components from designs in a components database and a number of materials for the number of the components from a materials database to form the number of boundaries for the wireless networks.

In yet another illustrative embodiment, an aircraft wireless network system comprises a number of components within an aircraft. The number of components has a configuration and is comprised of materials selected to form a number of boundaries within the aircraft that provide a desired propagation of wireless signals between devices in wireless networks in the aircraft.

In yet another embodiment, a configuration for wireless networks is identified in the aircraft. Multiple wireless systems are adapted to the boundaries for the purpose of 'tuning' a particular aircraft interior for a particular system or application. The technical effect achieved is improved performance of the on-board wireless system.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 1 is an illustration of a block diagram of an aircraft design environment in accordance with an illustrative embodiment;

FIG. 2 is an illustration of a block diagram of desired types of wireless signal propagation in accordance with an illustrative embodiment;

FIG. 3 is an illustration of a block diagram of a components database in accordance with an illustrative embodiment;

FIG. 4 is an illustration of a block diagram of examples of structures in accordance with an illustrative embodiment;

FIG. 5 is an illustration of a block diagram of a materials database in accordance with an illustrative embodiment;

FIG. 14 is another illustration of components used to form boundaries in accordance with an illustrative embodiment;

FIG. 15 is an illustration of a flowchart of a process for designing an aircraft in accordance with an illustrative embodiment;

DETAILED DESCRIPTION

Figure 6:
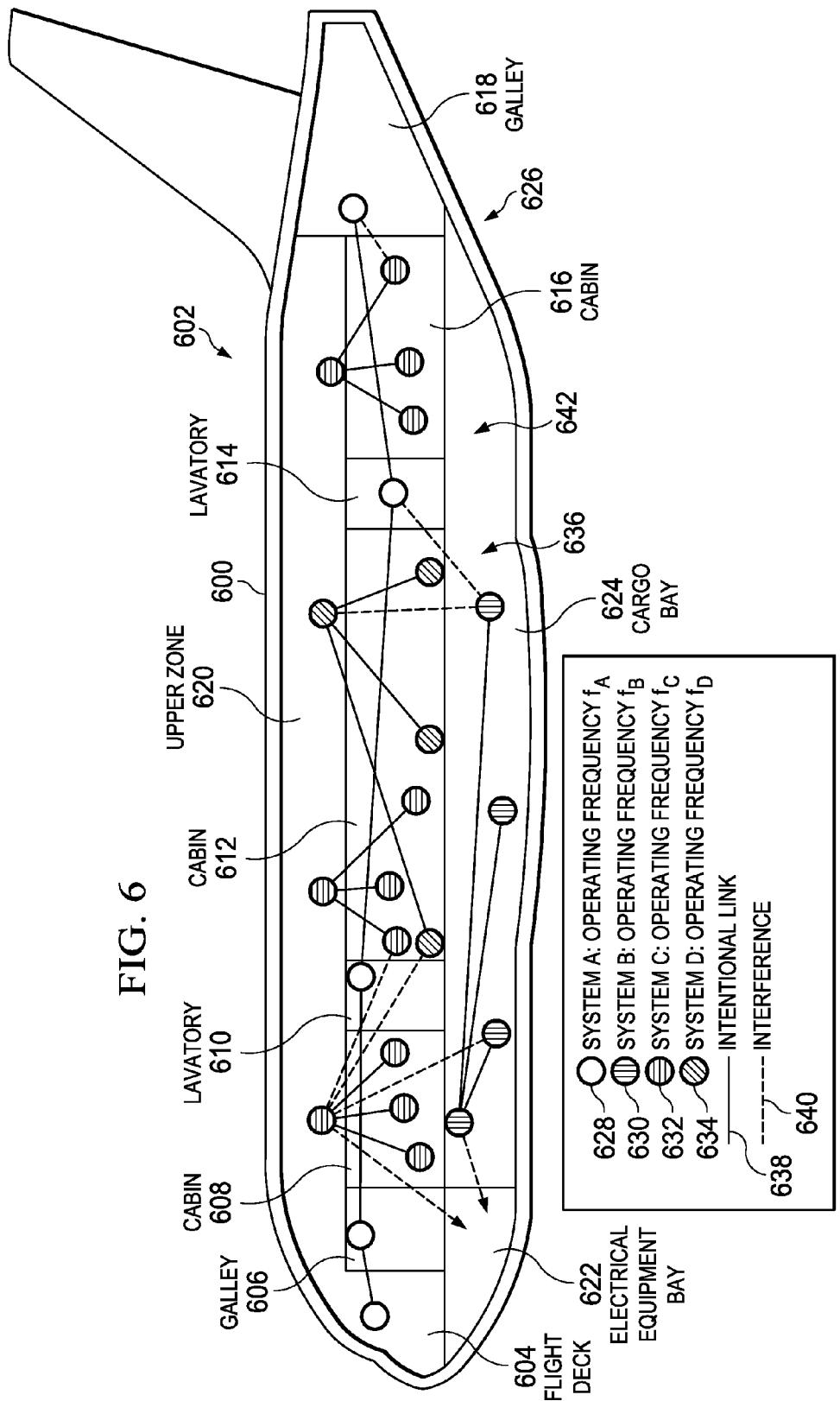
FIG. 6 is an illustration of areas within the interior of an aircraft in which wireless networks may be used in accordance with an illustrative embodiment.

The illustrative embodiments recognize and take into account one or more different considerations. The illustrative embodiments recognize and take into account that interferences between multiple wireless networks may be reduced by selecting particular channels for different networks. Each channel may be assigned a particular range of frequencies. In this manner, the enhanced cabin design reduces interference between different wireless networks. The technical effect of the cabin design is an intentional path for the wireless signals that experiences less cross talk, and improves general wireless performance and integration.

The illustrative embodiments recognize and take into account, however, that the number of channels may be limited. Further, some channels may overlap with other channels. As a result, in designing wireless networks, a greater separation of channels between different wireless networks is desirable. Consequently, some channels may be unused in some cases. Although the selection of different channels for different wireless networks may be useful, the different channels may increase the complexity of designing wireless networks and performing maintenance on wireless networks.

Thus, one or more illustrative embodiments provide a method and apparatus for an aircraft design system. In one illustrative example, the aircraft design system comprises a structures database, a materials database, and a boundary designer. The structures database has designs for structures configured for use in an aircraft. The materials database has materials selected for a desired type of wireless signal propagation. The boundary designer is configured to identify a configuration for wireless networks in the aircraft, select a number of boundaries for the wireless networks that provide a desired propagation of wireless signals for the wireless networks, and to select configurations for the number of structures from the designs in the structures database and select materials for the number of structures to form the number of boundaries for the number of networks.

With reference now to the figures and, in particular, with reference to FIG. 1, an illustration of a block diagram of an aircraft design environment is depicted in accordance with an illustrative embodiment. In this depicted example, aircraft design environment 100 includes aircraft design system 104. Boundary designer 102 in aircraft design system 104 may be used to generate boundary design 106 for use with aircraft design 108 in these illustrative examples. Boundary design 106 may be part of or a separate design from aircraft design 108 in this illustrative example. **\*\***

As depicted, aircraft design system 104 with boundary designer 102 may be implemented in computer system 110. Computer system 110 is comprised of one or more computers. When more than one computer is present, those computers may be in communication with each other using a medium such as a network.

In this illustrative example, boundary designer 102 and other components in aircraft design system 104 may be implemented in software, hardware, or a combination of the two. When software is used, the operations performed by the components in aircraft design system 104 may be implemented in program code to be run on a processor unit. When hardware is employed, the hardware may include circuits that operate to perform the operations for the components in aircraft design system 104.

In these illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, without limitation, a programmable logic array, a programmable array logic, a field programmable logic array, a field programmable gate array, and other suitable hardware devices.

Additionally, the processes may be implemented in organic components integrated with inorganic components and/or may be comprised entirely of organic components excluding a human being.

Additionally, aircraft design system 104 also includes components database 112 and materials database 114. Components database 112 is a collection of designs 116 for components 118 configured for use within fuselage 128 of aircraft 120. Components 118 may be configured to form structures 125 in fuselage 128. Additionally, components 118 also may be used to add components to structures in structures 125 or supplement existing ones of structures 125. In other examples, a component in components 118 may actually form a structure in structures 125 without needing other components in components 118.

Materials database 114 comprises materials 122 selected for desired types of wireless signal propagation 124. Materials 122 may be used with designs 116 for components 118 to provide desired types of wireless signal propagation 124 for components 118.

In these illustrative examples, aircraft design 108 for aircraft 120 may be used as an input to boundary designer 102 to generate boundary design 106 for aircraft 120. In these illustrative examples, aircraft design 108 includes fuselage 128. Areas 130 are present in fuselage 128. In these illustrative examples, areas 130 may include at least one of cabin area 132, crown area 133, crew area 134, cargo area 136, flight deck 138, and other suitable types of areas.

As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C, or item B and item C. In other examples, "at least one of" may be, for example, without limitation, two of item A, one of item B, and ten of item C; four of item B and seven of item C; and other suitable combinations.

Cabin area 132 is an area in which passengers may be located. Crown area 133 is an area above cabin area 132. Crew area 134 is an area in which crew members may rest. Cargo area 136 is an area in which cargo is stored. Flight deck 138 is an area in which the aircraft crew operates the aircraft.

In these illustrative examples, aircraft design 108 also may include wireless networks 140 within fuselage 128. In these illustrative examples, wireless networks 140 may include at least one of passenger cabin network 142, avionics network 144, flight deck network 146, cargo bay network 148, light control network 150, environmental control network 152, and other suitable types of networks.

In another illustrative example, boundary designer 102 is able to automatically identify the configuration from the selected components and boundary designer 102 automatically cross-references the components database 112 and materials database 114. One or more of these databases may include the baseline aircraft structures to more rapidly include, exclude, and include and exclude those incompatible elements to and from the generated configuration.

In these illustrative examples, boundary designer 102 is configured to identify configuration 154 for wireless networks 140 for aircraft 120 in aircraft design 108. Boundary designer 102 also may be configured to select number of boundaries 155 for wireless networks 140 that provide desired types of wireless signal propagation 124 for wireless networks 140. In other words, number of boundaries 155 for the wireless networks 140 may improve wireless performance and integration for wireless networks 140.

Further, boundary designer 102 is configured to identify configuration 156 for a number of components 118 for boundary design 106. Configuration 156 for number of components 118 is used to form number of boundaries 155. In other words, number of boundaries 155 may include configuration 156 of components 118. Additionally, number of boundaries 155 may include other structures in aircraft 120, depending on the particular implementation.

In these illustrative examples, configuration 156 in boundary design 106 may be a configuration of components 118, a configuration of components 118 with respect to each other within fuselage 128, or some combination thereof. Additionally, boundary designer 102 also may be configured to select a number of materials 122 for the number of components 118 used to form number of boundaries 155 for wireless networks 140. The selection of materials 122 for components 118 is part of configuration 156. In these illustrative examples, materials 122 selected for configuration 156 of components 118 may be selected such that components 118 have desired types of wireless signal propagation 124.

Number of boundaries 155 may be configured to define areas 130 within fuselage 128 for wireless networks 140. Areas 130 may be areas in which wireless signals propagate for different networks within wireless networks 140 in a desired manner. In other words, areas 130 may be areas in which interference caused by signals from a network outside of the area may be reduced. For example, an area within areas 130 may be defined by number of boundaries 155 for one network while another area in areas 130 may be defined by number of boundaries 155 for another network in wireless networks 140.

Further, number of boundaries 155 also may be configured in a manner that provides a desired separation of the wireless signals between wireless networks in wireless networks 140. The separation of the wireless signals between wireless networks in wireless networks 140 may be performed to avoid undesired access of one wireless network from another wireless network in wireless networks 140. In other words, the separation of wireless signals 162 may occur in a manner such that a device located in a first area for a first wireless network is unable to access devices in a second area in a second wireless network.

In addition, boundary designer 102 may generate boundary design 106 in a manner that reduces the complexity for simulation 160 of wireless signals 162 in aircraft 120. For example, number of boundaries 155 may be configured to isolate undesired areas 166 in fuselage 128 that have components that increase the complexity of simulating the propagation of wireless signals 162.

In one illustrative example, undesired areas 166 in crown area 133 or just below the floor of cabin area 132 may have an enormous amount of complex geometry and materials. For example, various structural components, wires, pipes, tubes, and other structures may be present.

These different structures may all have numerous different types of materials in which each material may affect the propagation of wireless signals differently. As a result, performing simulation 160 for wireless signals 162 that include undesired areas 166 may be prohibitively costly, time consuming, and/or impossible in some cases.

By using boundary designer 102 to generate boundary design 106 with number of boundaries 155 that isolate these areas, simulation 160 may be made simpler with respect to simulating wireless signals 162 within aircraft 120. Further, simulation 160 also may be more accurate without having to take into account all of the different structures and materials in undesired areas 166 where the propagation of wireless signals 162 may not be desirable. Thus, wherein the boundary designer is further configured to select the number of boundaries to configure at least one of a desired separation of the wireless signals and a desired optimization of the wireless signals between the wireless networks, and a desired optimization of the wireless signals within a wireless network. The optimization may be, for example, to increase the distance at which wireless signals travel, reducing the propagation of undesired signals, and other desired propagation of wireless signals between networks, within networks, or a combination thereof.

The illustration of aircraft design environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although boundary designer 102 has been described with respect to generating boundary design 106 for use in aircraft design 108, boundary designer 102 may be used to generate designs for other types of platforms other than an aircraft. For example, without limitation, other illustrative embodiments may be applied to a mobile platform, a stationary platform, a land-based structure, an aquatic-based structure, a space-based structure, and/or some other suitable platform. More specifically, the different illustrative embodiments may be applied to generating designs for platforms such as, for example, without limitation, a submarine, a bus, a personnel carrier, a tank, a train, an automobile, a spacecraft, a space station, a satellite, a surface ship, a power plant, a dam, a manufacturing facility, a building, and/or some other suitable platform.

Turning now to FIG. 2, an illustration of a block diagram of desired types of wireless signal propagation is depicted in accordance with an illustrative embodiment. Examples of desired types of wireless signal propagation 124 are depicted in these illustrative examples. As depicted, desired types of wireless signal propagation 124 include at least one of reflective propagation 200, transmissive propagation 202, absorptive propagation 204, selectively reflective propagation 206, selectively transmissive propagation 208, selectively absorptive propagation 210, and other types of wireless signal propagation.

Reflective propagation 200 is a type of wireless signal propagation in which wireless signals are reflected by structures. Reflective propagation 200 may be desired to create a boundary in number of boundaries 155 in defining an area in areas 130 in FIG. 1. In these illustrative examples, reflective propagation 200 may be achieved by using materials that are conductive.

Transmissive propagation 202 is a type of wireless signal propagation in which the wireless signals are allowed to travel through the structure.

Transmissive propagation 202 may be desirable as a type of wireless signal propagation for a component in components 118 when that component is not part of a boundary in number of boundaries 155. In other words, if the component is not selected or desired for use in forming a boundary in number of boundaries 155, that component may be constructed to have transmissive propagation 202 as a desired type of wireless signal processing in desired types of wireless signal propagation 124 in defining areas 130 for wireless networks 140 in fuselage 128.

For example, a cabin may be present that is configured for use by passengers. In particular, a network may be configured for use by passengers in two or more cabin areas divided by a wall. With this type of network, transmission of wireless signals through the wall between the two cabins is desirable. As a result, that wall may be comprised of components made of transmissive materials.

Absorptive propagation 204 is a type of wireless signal propagation in which the structure absorbs the wireless signal rather than allowing it to be reflected or transmitted through the structure. In these illustrative examples, absorptive propagation 204 may be accomplished as a desired type of wireless signal propagation through the use of materials that are resistive with respect to wireless signals.

Absorptive propagation 204 may be desirable when limits to a multi-path transmission are desirable. Multi-path transmissions may occur when a copy of a data packet occurs as a result of a reflection off of a surface. For example, a transmitter may send the data packet over a wireless signal to a receiver through a line-of-sight path that is unobstructed or through a surface that is transmissive. At a later time, the same data packet in a wireless signal is reflected off of a nearby surface and shows up at the receiver. Depending on the protocol and hardware of the wireless system, such a copied signal may be beneficial or adverse. The choice of reflective, transmissive, or absorptive propagation would be chosen accordingly.

In another example, two physical spaces with different wireless systems may be in operation on either side of a transition area. Absorptive boundary propagation may be selected over reflective boundary propagation so that multi-path transmission near the transition area is eliminated to reduce the likelihood of interference between the different wireless systems.

Selectively reflective propagation 206 is a type of wireless signal propagation in which some wireless signals are reflected while others are not. Selectively reflective propagation 206 is also a type of wireless signal propagation in which a number of frequencies of wireless signals may be reflected. These numbers of frequencies may be individual frequencies or a range of frequencies. When a range of frequencies is selected, the range may be continuous or in different portions. Other frequencies may be transmitted, absorbed, or some combination thereof when the desired type of signal propagation is selectively reflective.

A component that has selectively reflective propagation 206 may absorb or allow transmission of other components. In other words, a component may have a combination of types of wireless signal propagation in desired types of wireless signal propagation 124.

In these illustrative examples, selectively transmissive propagation 208 is a type of wireless signal propagation in which the structure may allow for a number of frequencies of wireless signals to be transmitted through the structure. Again, the number of frequencies may be a single frequency or some range of frequencies. Other signals may be reflected, absorbed, or both depending on the particular implementation.

Selectively absorptive propagation 210 is a type of wireless signal propagation in which a structure absorbs a number of frequencies of wireless signals that may be a single frequency or a range of frequencies. Other wireless signals of other frequencies may be reflected, transmitted, or some combination thereof.

In these illustrative examples, a structure within structures 125 may have some combination of desired types of wireless signal propagation 124 depending on the particular implementation. For example, a structure in structures 125 may be selectively reflective such that a range of frequencies are reflected. The structure may also be selectively transmissive such that a range of frequencies are transmitted while the rest of the frequencies are absorbed. This structure may be considered to have selectively reflective propagation 206, selectively transmissive propagation 208, and selectively absorptive propagation 210 as desired types of wireless signal propagation 124.

These examples of desired types of wireless signal propagation 124 are examples of wireless propagation that may be implemented in different components in components 118 in fuselage 128 with configuration 156 to form number of boundaries 155 in fuselage 128. Of course, other types and combinations of types of desired wireless signal propagation may be used in other illustrative embodiments.

Desired type of wireless signal propagation 124 may be achieved through various configurations of components 118. In particular, the different types of wireless signal propagation in desired types of wireless signal propagation 124 may be configured through a selection of materials 122 from materials database 114 and the configuration of materials 122 in components 118.

For example, selective propagation such as selectively reflective propagation 206, selectively transmissive propagation 208, and selectively absorptive propagation 210, or some combination thereof may be achieved by modifying structural components and materials to act as filters. For example, if an otherwise transmissive panel, such as fiberglass, were loaded with conductive metallic particles at very low densities, the panel would allow lower frequency signals to penetrate, while causing higher frequency signals to reflect. By increasing or decreasing the density of the particles, the frequency breakpoints would shift downward or upward, respectively.

Turning now to FIG. 3, an illustration of a block diagram of a components database is depicted in accordance with an illustrative embodiment. In this depicted example, examples of designs 116 for components 118 in components database 112 are depicted.

In these illustrative examples, designs 116 for components 118 may include, for example, without limitation, panel 300, insulation blanket 302, gasket 304, shroud 306, carpet 308, grate 310, cage 312, radio frequency aperture 314, appliqué 316, curtain 320, volume absorber 324, grid 326, fabric 328, coating 330, plate 332, and other suitable types of structures.

Panel 300 may be a panel that is substantially planar or has curved, irregular, or other shapes. Panel 300 is a component that may be used in forming structures such as a stowage bin, a lavatory, a ceiling, a floor, a partition, a closet, a galley, and other types of structures.

Insulation blanket 302 is a structure that may be placed around or between other structures. For example, insulation blanket 302 may be used between different panels. Gasket 304 may be used to fill seams between components such as panels. In other words, gasket 304 may be used to cover gaps. These gaps are gaps in which radio frequency signals may propagate in these illustrative examples. Shroud 306 may be a component that is used to encapsulate or form a boundary or a portion of a boundary for certain areas. For example, shroud 306 may be used with stowage bins, closets, or other structures.

Carpet 308 is a component that may be found on the floor, walls, and other locations in an aircraft. Grate 310 is a component that allows for the flow of air. Cage 312 is a component configured to encapsulate areas in which electronic devices may be located. For example, cage 312 may encapsulate an electrical equipment bay or other areas.

Radio frequency aperture 314 may provide an aperture in another component. Radio frequency aperture 314 is a component that allows certain frequencies to pass through a structure that may otherwise be reflected or absorbed.

Appliqué 316 is a component that may be placed on different components to provide a desired type of wireless signal propagation. Appliqué 316 may include a decorative design and may be placed in locations such as a wall, a door, or on some other structure. Curtain 320 is a structure that may be used to partition areas within a cabin bay. For example, curtain 320 may be used to separate an economy class portion of the cabin from a business class portion of the cabin.

Volume absorber 324 may be implemented in other components. For example, volume absorber 324 may be located in panel 300, within cushions in a passenger seat, and other structures. Additionally, volume absorber 324 may be placed into other areas within fuselage 128.

Grid 326 is a component that may be implemented within other components such as panel 300, and/or other suitable structures. Grid 326 may be made to be conductive, resistive, or have other suitable types of wireless signal propagation.

Fabric 328 may be used to cover other components and/or structures. For example, fabric 328 may be used to cover a passenger seat, a wall, and/or some other structure. Coating 330 is a component that may be formed on other components and/or structures to provide a desired type of wireless signal propagation. Coating 330 may be sprayed, painted, or otherwise formed on the surface of other components and/or structures.

Plate 332 may be implemented within other components and/or structures. For example, plate 332 may be placed inside of panel 300, a monument, and other suitable structures.

Designs 116 for components 118 illustrated in this example may have any combination of desired types of wireless signal propagation 124 as depicted in FIG. 2. The desired type of wireless signal propagation provided may be configured based on materials used to from the different structures depicted in this illustrative example.

With reference now to FIG. 4, an illustration of a block diagram of examples of structures is depicted in accordance with an illustrative embodiment. In this illustrative example, structures 125 may take a number of different forms in fuselage 128. For example, structures 125 may comprise at least one of cabin wall 400, bulkhead 406, closet 408, lavatory 410, ceiling 412, stowage bin 414, passenger seat 416, galley 418, floor 420, partition 422, and other suitable types of structures. In these illustrative examples, structures 125 may be comprised of one or more of components 118 that are configured to provide desired types of wireless signal propagation 124. In particular, one or more materials 122 in materials database 114 may be used in components 118 to provide desired types of wireless signal propagation 124 for use in forming structures 125.

Turning now to FIG. 5, an illustration of a block diagram of a materials database is depicted in accordance with an illustrative embodiment. In this depicted example, materials 122 in materials database 114 are examples of materials that may be used in forming components 118.

As depicted, materials 122 in materials database 114 may include at least one of conductive material 502, resistive material 504, and neutral material 506. In these illustrative examples, conductive material 502 may be used in a component to provide a reflective type of wireless propagation. Conductive material 502 may be, for example, without limitation gold, silver, aluminum, and other suitable metals or metal alloys.

Resistive material 504 may be used in a component to provide an absorptive type of propagation. Resistive material 504 may be, for example, without limitation, carbon, wood, fiberglass, and other suitable materials. For example, carbon may be integrated into the materials used to form components. In other examples, carbon may be coated on components.

Neutral material 506 is a material that is neither conductive nor resistive. In these illustrative examples, neutral material 506 may be low-loss and may provide for transmissive types of propagation. For example, neutral material 506 may be plastic, polyester, composite materials, and other suitable types of materials.

In these illustrative examples, different combinations of these materials may be used in components 118 to provide desired types of wireless signal propagation 124. The combination of materials 122 may be used to provide one or more types of desired types of wireless signal propagation 124 in a component.

The illustration of aircraft design environment 100 and different components used in aircraft design environment 100 in FIGS. 1-5 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

With reference now to FIG. 6, an illustration of areas within the interior of an aircraft in which wireless networks may be used is depicted in accordance with an illustrative embodiment. In these illustrative examples, aircraft 600 is an example of aircraft 120 that may be manufactured using aircraft design 108 with boundary design 106.

In this depicted example, aircraft 600 includes areas 602. In these illustrative examples, areas 602 include flight deck 604, galley 606, cabin 608, lavatory 610, cabin 612, lavatory 614, cabin 616, galley 618, upper zone 620, electrical equipment bay 622, and cargo bay 624.

In this illustrative example, wireless networks 626 are present in aircraft 600. Wireless networks 626 include crew communications system 628, smoke detection system 630, entertainment system 632, and emergency lighting system 634. Additionally, wireless communications links 636 are depicted within aircraft 600. In particular, wireless communications links 636 include desired wireless communications links 638 and undesired wireless communications links 640 in this illustrative example. Desired wireless communications links 638 represent examples of desired propagation of wireless signals between different components within wireless networks 626. Undesired wireless communications links 640 represent interference in the form of undesired propagation of wireless signals between different components within wireless networks 626.

In these illustrative examples, boundaries 642 are present within aircraft 600 around areas 602 to provide for desired types of wireless signal propagation within areas 602. Boundary designer 102 may be used to select boundaries 642 in a manner that reduces undesired wireless communications links 640 while promoting desired wireless communications links 638.

The illustration of aircraft 600 and wireless networks 626 is not meant to imply limitations to the manner in which other illustrative embodiments may be implemented. For example, illustrative embodiments may have additional or fewer areas within areas 602. In some illustrative examples, aircraft 600 may have more than one deck in which passenger cabins are present. In still other illustrative examples, other wireless networks may be present in addition to or in place of wireless networks 626 as illustrated in FIG. 6. For example, without limitation, other wireless networks may include a sensor system, a health monitoring system, an engine control system, and other suitable types of systems that may use wireless networks.

Figure 7:
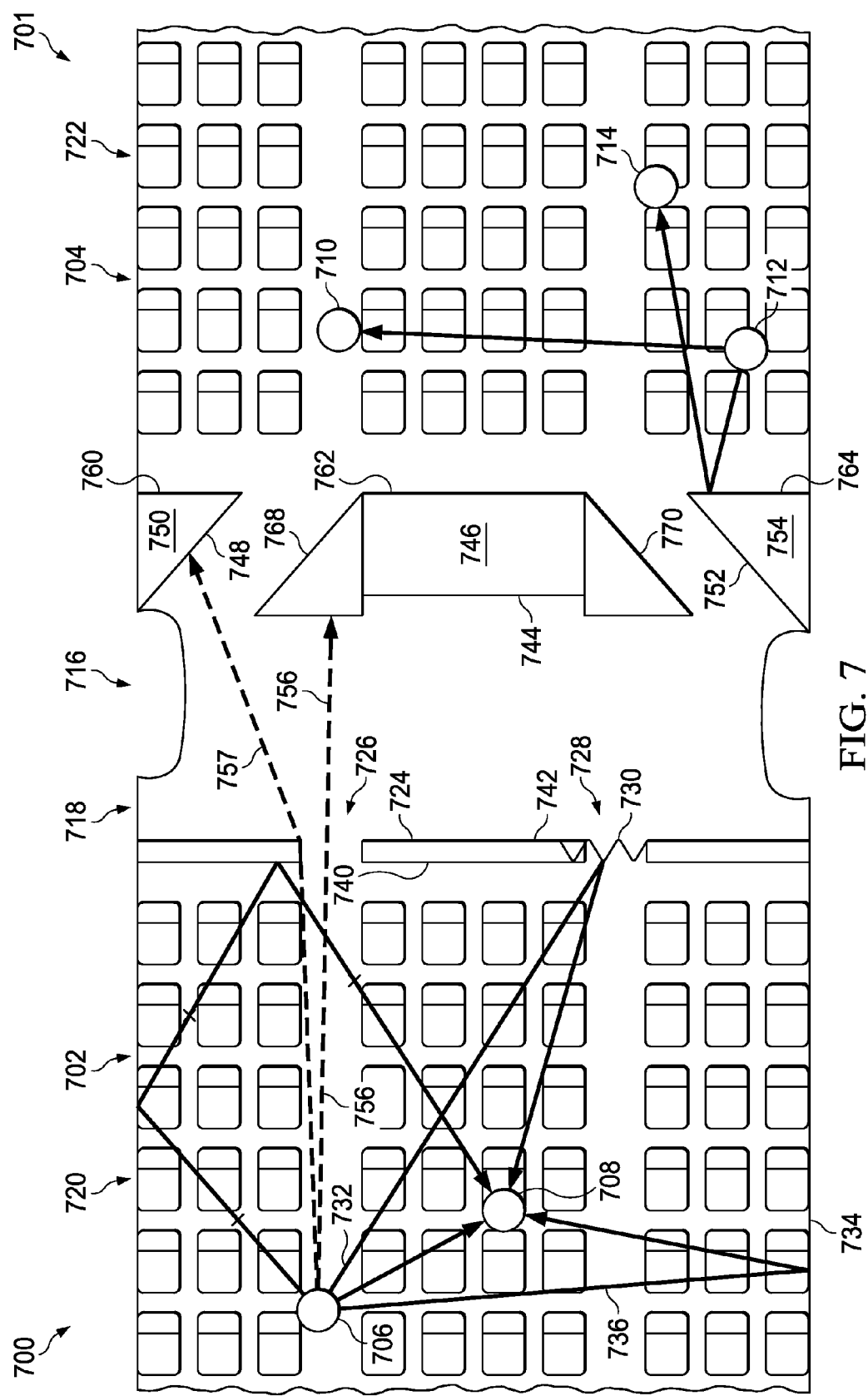
FIG. 7 is an illustration of passenger cabins in an aircraft in accordance with an illustrative embodiment.

With reference now to FIG. 7, an illustration of passenger cabins in an aircraft is depicted in accordance with an illustrative embodiment. In this illustrative example, passenger cabin 700 and passenger cabin 701 are examples of one implementation for cabin 608 and cabin 612 in FIG. 6. As depicted, passenger cabin 700 and passenger cabin 701 include network 702 and network 704, respectively. Network 702 comprises transmitter 706 and receiver 708. Network 704 comprises transmitter 712, receiver 710 and receiver 714.

In this illustrative example, structures 716 form boundary 718 between area 720 in passenger cabin 700 and area 722 in passenger cabin 701. Area 720 is for network 702 while area 722 is for network 704. In these illustrative examples, the transmission of signals from transmitter 706 from area 720 into area 722 is undesirable. In a similar fashion, the transmission of signals from transmitter 712 in area 722 into area 720 also is undesirable.

In these illustrative examples, structures 716 provide a number of types of wireless signal propagation in passenger cabin 700. As depicted, structures 716 are configured to prevent signals from transmitter 706 in area 720 from reaching receiver 710 and receiver 714 in area 722. In a similar fashion, structures 716 may be configured to prevent signals from transmitter 712 from reaching receiver 708 in area 720.

For example, wall 724 may have a type of wireless signal propagation that is reflective. Wall 724 has opening 726 and opening 728. Curtain 730 in opening 728 may have a type of wireless signal propagation that is reflective. In this manner, signals such as those following path 732 may be reflected in a desired fashion within area 720 to reach receiver 708.

In a similar fashion, wall 734 also may be reflective. With this type of wireless signal propagation, wireless signals traveling along path 736 also may be reflected in a desired fashion to reach receiver 708.

In these illustrative examples, the reflectivity of wall 724 is on side 740. Side 742 of wall 724 may be absorptive. In this manner, any signals that may stray out of area 722 may be absorbed by side 742 of wall 724.

In a similar fashion, side 744 of galley 746, side 748 of lavatory 750, and side 752 of lavatory 754 may be absorptive. With this type of wireless signal propagation provided by side 744 of galley 746, side 748 of lavatory 750, and side 752 of lavatory 754, signals that may stray out of area 720 through opening 726 and opening 728 in wall 724 may be absorbed before reaching area 722.

In a similar fashion, side 760 of lavatory 750, side 762 of galley 746 and side 764 of lavatory 754 may be reflective such that signals traveling within area 722 are reflected in a desired manner. In this illustrative example, side 768 and side 770 of galley 746 may be absorptive to reduce signals from area 722 traveling into area 720.

For example, if wireless signals from transmitter 706 travel along path 756, those signals are absorbed by side 744 of galley 746 instead of traveling through galley 746 to reach area 722. In a similar fashion, if wireless signals travel along path 757, those wireless signals may be absorbed by side 748 of lavatory 750. In these illustrative examples, components such as panels, fabrics, grids, coatings, and other suitable components may be used to form structures 716 to have the desired types of wireless signal propagation.

Figure 8:
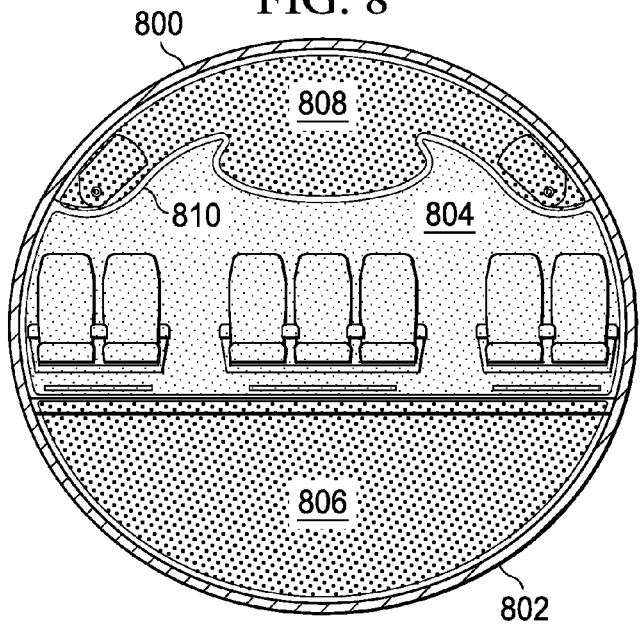
FIG. 8 is an illustration of a cross section of a fuselage in accordance with an illustrative embodiment.

Turning now to FIG. 8, an illustration of a cross section of a fuselage is depicted in accordance with an illustrative embodiment. In this illustrative example, a cross-sectional view of fuselage 800 for aircraft 802 is depicted. In this cross-sectional view, three areas are illustrated. The areas include cabin area 804, cargo area 806, and crown area 808.

In these illustrative examples, number of boundaries 810 separates these areas from each other. In this manner, a desired type of propagation for wireless signals for a first network may occur within cabin area 804. A second network may transmit wireless signals within cargo area 806. A third network may transmit wireless signals within crown area 808 in these illustrative examples.

In still other illustrative examples, crown area 808 may be an area in the aircraft in which the transmission and propagation of signals from other areas is undesirable. For example, crown area 808 may include numerous components that make simulating the propagation of signals within aircraft 802 more complex than desired. As a result, simulating the propagation of signals into crown area 808 may not be as accurately simulated as desired.

With the design of number of boundaries 810 to reduce or eliminate the propagation of signals into crown area 808, the simulation of signals within aircraft 802 may be simpler.

In currently used cabins, the number of boundaries typically does not take into account desired types of propagation. The different structures that form number of boundaries 810 may include, for example, walls, a ceiling, a stowage bin, a floor, and other structures. These structures may be comprised of components such as, for example, without limitation, a panel, carpet, a grate, and other suitable components. These components may include materials made of plastic, fiberglass, graphite, and other materials. These materials are typically not selected to take into account a desired type of wireless signal propagation for a network. As a result, these components may allow the transmission of wireless signals through these components into other areas such as crown area 808. In those areas, numerous other components may reflect and absorb the wireless signals in a manner that is difficult to simulate.

In these illustrative embodiments, number of boundaries 810 may be designed such that signals within cabin area 804 are reflected back into cabin area 804 at number of boundaries 810. Further, number of boundaries 810 also may be designed to reduce signals from other networks from entering cabin area 804. As a result, the simulation of wired signals within crown area 808 may be unnecessary.

In another example, portions of cargo area 806 may have a complexity of structures and materials that also may make this area undesirable for the propagation and simulation of wireless signals. In a similar fashion, number of boundaries 810 also may reduce or eliminate the propagation of signals into cargo area 806.

In these illustrative examples, number of boundaries 810 may cause a reflection of signals within cabin area 804. In other illustrative examples, the design of number of boundaries 810 may be such that materials and components and/or structures forming number of boundaries 810 may absorb, reflect, or absorb and reflect wireless signals. This type of wireless signal propagation is such that those wireless signals do not reach undesired areas such as crown area 808, cargo area 806, or both.

When only cabin area 804 is a concern with respect to the propagation of wireless signals, the simulation of wireless signal propagation within cabin area 804 may be simpler when attenuation, losses, and reflection of signals by components in cargo area 806 and crown area 808 are not a factor. As a result, the simulation of the performance of a wireless network in cabin area 804 may be easier to perform.

Consequently, a more deliberate design of a wireless network in cabin area 804 may occur. For example, the placement of receivers, transmitters, routers, access points, and other components in a wireless network may be optimized or designed to provide a desired optimization of wireless signals between networks, within networks, or a combination thereof. With the optimization, fewer components may be needed in the wireless network to obtain the desired level of performance. The optimization may take various forms. For example, the optimization may be with respect to a strength of wireless signals, a containment of wireless signals within an area, and other suitable factors.

In another example, optimization of wireless signals may include increasing reflection of wireless signals, while decreasing absorption in areas where transceivers are co-located in a multi-in multi-out network. The wireless signals in this example have a longer range and are more likely to reach a transceiver.

In still another example, increasing battery life of components may be desired. The battery life may optimize the propagation of wireless signals by increasing reflectivity in the area of the component. The reflectivity may increase the amplitude of wireless signals reaching receivers, such that receivers may use less power.

In still another example, the optimization of wireless signals may occur by reducing reflectivity of signals. The reduction in reflectivity may decrease the number of copies of signals that are sent. The reflectivity may be reduced by the use of materials to absorb wireless signals.

Figure 9:
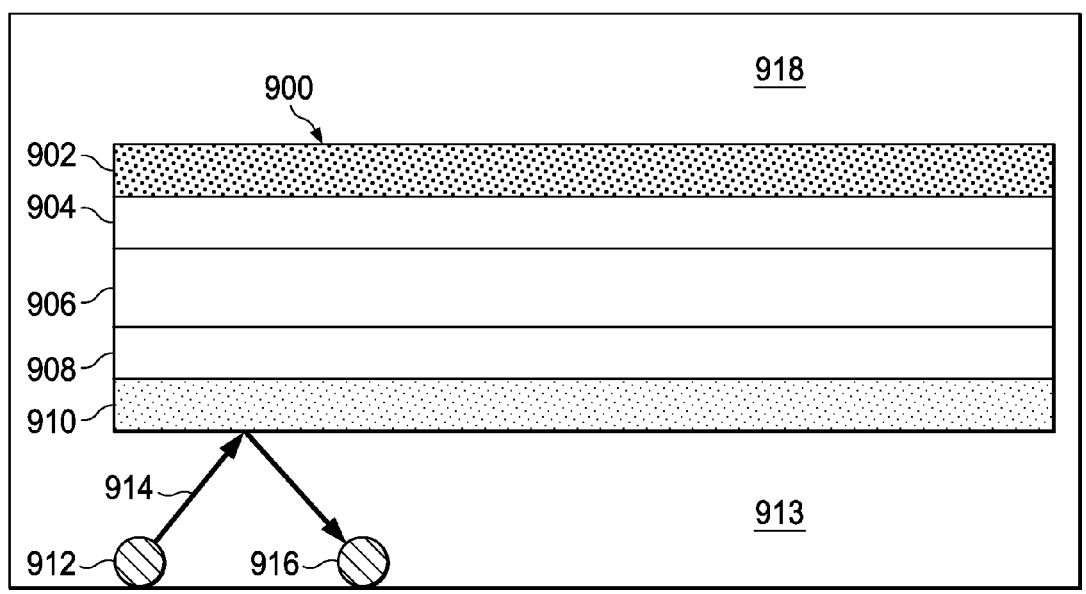
FIG. 9 is an illustration of a panel in accordance with an illustrative embodiment.

Turning now to FIG. 9, an illustration of a panel is depicted in accordance with an illustrative embodiment. As depicted, panel 900 is an example of a component in designs 116 in components database 112. In this illustrative example, panel 900 may be used in various structures to form boundaries for areas in which wireless networks operate.

As illustrated, panel 900 comprises resistive layer 902, first facesheet 904, core 906, second facesheet 908, and conductive layer 910. Resistive layer 902 is located on first facesheet 904, and conductive layer 910 is located on second facesheet 908. These two layers may be coatings, appliqués, or some combination thereof. Further, these layers also may be formed as part of the facesheets.

Conductive layer 910 is configured to provide a reflective type of wireless signal propagation. Resistive layer 902 is configured to provide an absorptive type of wireless signal propagation.

For example, wireless signals transmitted by transmitter 912 in cabin area 913 may follow path 914 to reach receiver 916. As can be seen, conductive layer 910 reflects the wireless signals as shown by path 914. In other words, wireless signals transmitted by transmitter 912 do not pass through panel 900.

Wireless signals from area 918 outside of cabin area 913 that pass into panel 900 are absorbed by resistive layer 902. In this manner, wireless signals from area 918 do not cross into cabin area 913. In this manner, panel 900 is used in forming a boundary to separate cabin area 913 and area 918 from each other.

Figure 10:
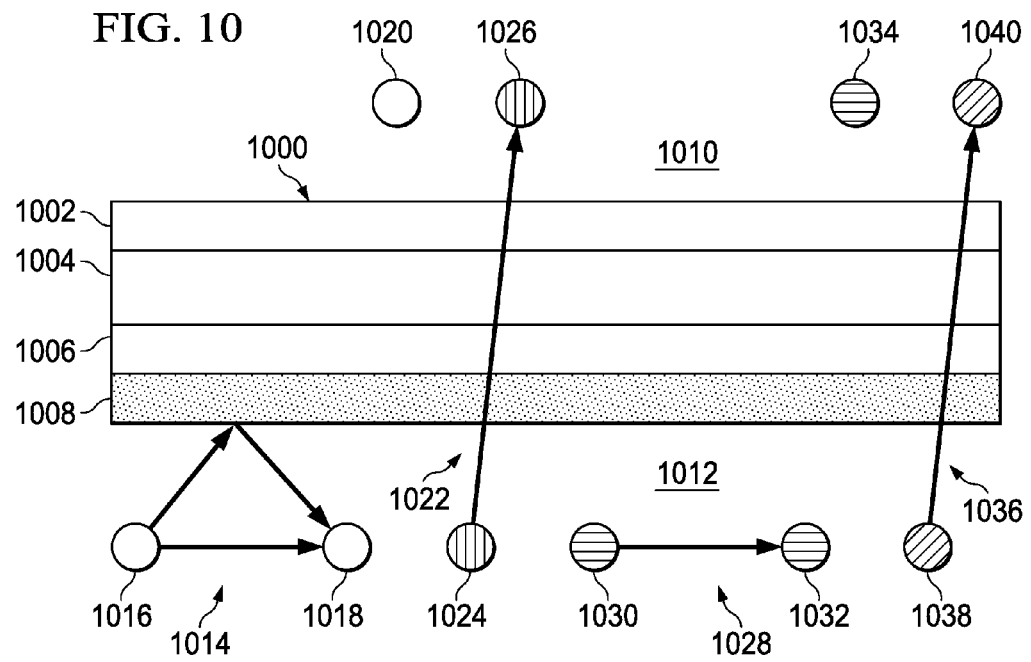
FIG. 10 is another illustration of a panel in accordance with an illustrative embodiment.

Turning now to FIG. 10, another illustration of a panel is depicted in accordance with an illustrative embodiment. As depicted, panel 1000 is an example of a component in designs 116 in components database 112. In this illustrative example, panel 1000 may be used in various structures to form boundaries for areas in which wireless networks operate.

In this illustrative example, panel 1000 is comprised of first facesheet 1002, core 1004, second facesheet 1006 and frequency selective layer 1008. In this illustrative example, panel 1000 is used as a boundary between area 1010 and area 1012.

In this illustrative example, wireless network 1014 includes transmitter 1016, receiver 1018, and receiver 1020. Wireless network 1022 includes transmitter 1024 and receiver 1026. Wireless network 1028 includes transmitter 1030, receiver 1032, and receiver 1034. Wireless network 1036 includes transmitter 1038 and receiver 1040. Of course, additional transmitters and receivers may be present but are not shown in these examples.

Further, wireless network 1014, wireless network 1022, wireless network 1028, and wireless network 1036 operate at different frequencies. In this illustrative example, these frequencies are selected such that wireless signals generated by the different networks do not interfere with each other.

In this illustrative example, wireless network 1014 is a multi-input multi-output (MIMO) network located in area 1010 and area 1012. Although wireless network 1014 is located in both areas, it is undesirable for wireless signals in one area to cross into another area. For example, signals transmitted by transmitter 1016 should be received by receiver 1018, but not by receiver 1020.

Wireless network 1022 is located in both area 1010 and area 1012. However, with wireless network 1022, it is desirable for wireless signals to travel between these areas. For example, signals transmitted by transmitter 1024 should be received by receiver 1026.

Wireless network 1028 is a multiple-input multiple-output (MIMO) network and is also located in both area 1010 and area 1012. Wireless signals for this network crossing between the areas is undesirable.

In a similar fashion, wireless network 1036 is located in area 1010 and area 1012. With wireless network 1036, it is desirable for signals to cross between area 1010 and area

1012. For example, wireless signals generated by transmitter 1038 should be received by receiver 1040.

As depicted, the different networks illustrated have different requirements as to whether wireless signals for those networks should cross between area 1010 and area 1012. For example, with wireless network 1014 and wireless network 1028, having wireless signals cross between area 1010 and 1012 is undesirable. With wireless network 1022 and wireless network 1036, it is desirable for wireless signals to cross between area 1010 and area 1012 in this illustrative example.

Panel 1000 is configured to provide the desired types of wireless signal propagation for wireless network 1014, wireless network 1022, wireless network 1028, and wireless network 1036. In particular, the use of frequency selective layer 1008 on panel 1000 provides the desired types of wireless signal propagation. Frequency selective layer 1008 is configured to provide a desired type of propagation for these different wireless networks.

As depicted, frequency selective layer 1008 is comprised of one or more materials that are configured to be selectively reflective and selectively transmissive with respect to wireless signals. The materials used are selected to reflect signals at some ranges of frequencies and to allow wireless signals to pass at other ranges of frequencies.

For example, frequency selective layer 1008 may be configured such that a wireless signal transmitted by transmitter 1030 will be received by receiver 1032, but not by receiver 1034. In particular, frequency selective layer 1008 may be configured to reflect frequencies at which wireless network 1014 and wireless network 1028 operate. Frequency selective layer 1008 may be configured to allow frequencies at which wireless network 1022 and wireless network 1036 pass through. This type of frequency selection may be implemented using a configuration of materials that act as a high pass filter that has a bandstop.

Figure 11:
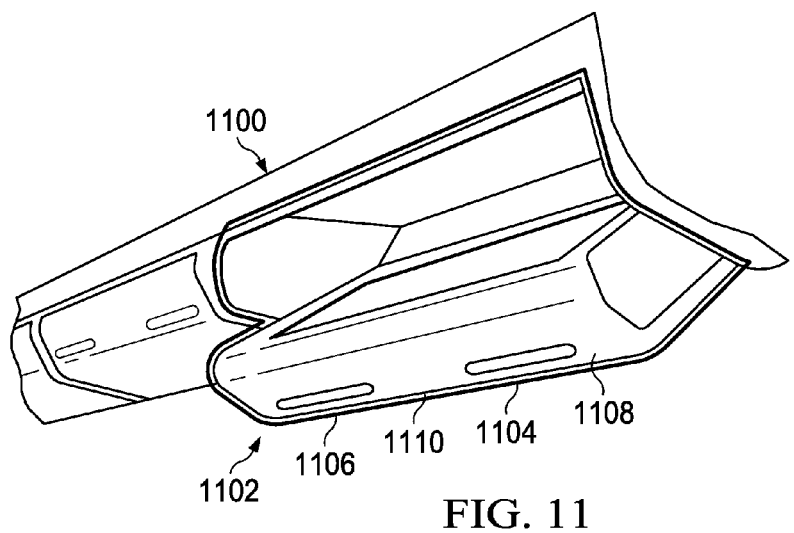
FIG. 11 is an illustration of a component used with a structure to reflect signals in accordance with an illustrative embodiment.

With reference now to FIG. 11, an illustration of a component used with a structure to reflect signals is depicted in accordance with an illustrative embodiment. In this illustrative example, structure 1100 takes the form of stowage bin 1102. Stowage bin 1102 is an example of a physical implementation for stowage bin 414 shown in block form in FIG. 4.

Component 1104 is a component used with stowage bin 1102 to provide a desired type of wireless signal propagation. As depicted, component 1104 is a reflective component that takes the form of shroud 1106. Shroud 1106 may be draped over stowage bin 1102. Additionally, stowage bin lid 1108 may have reflective layer 1110. In this manner, storage bin 1102 may be reflective whether stowage bin 1102 is open or closed.

Figure 12:
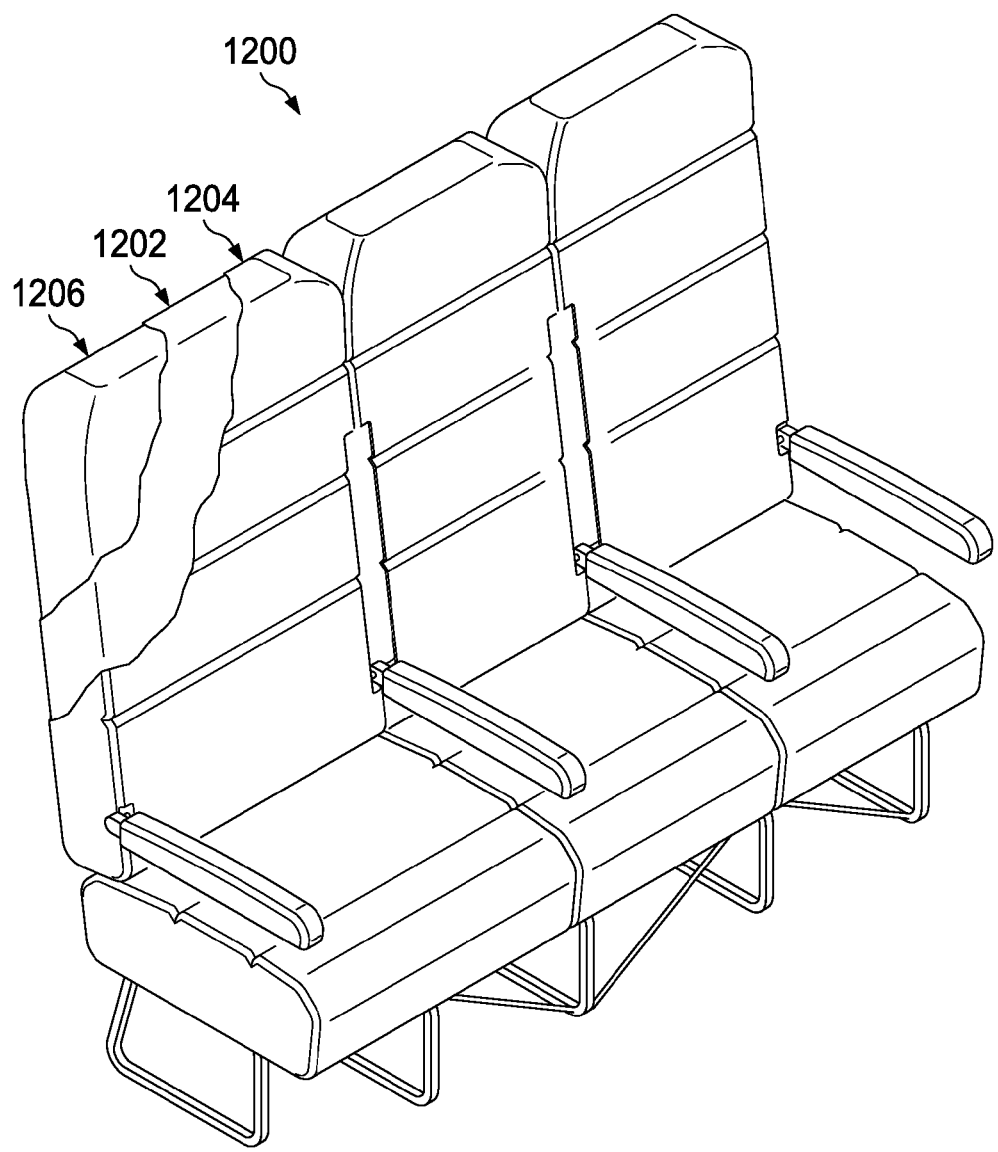
FIG. 12 is an illustration of structures with components used to obtain a desired type of wireless signal propagation in accordance with an illustrative embodiment.

Turning now to FIG. 12, an illustration of structures with components used to obtain a desired type of wireless signal propagation is depicted in accordance with an illustrative embodiment. Passenger seats 1200 are examples of physical implementations for passenger seat 416 shown in block form in FIG. 4.

In this depicted example, passenger seats 1200 may be made reflective. For example, as can be seen in this exposed view, conductive shroud 1202 is placed between outer upholstery 1204 and foam 1206 for passenger seats 1200. In this manner, wireless signals may be reflected by conductive shroud 1202 rather than penetrating foam 1206 and interacting with metal components in the seat frames of passenger seats 1200. In this manner, passenger seats 1200 may be isolated from wireless signals propagating within the area.

Figure 13:
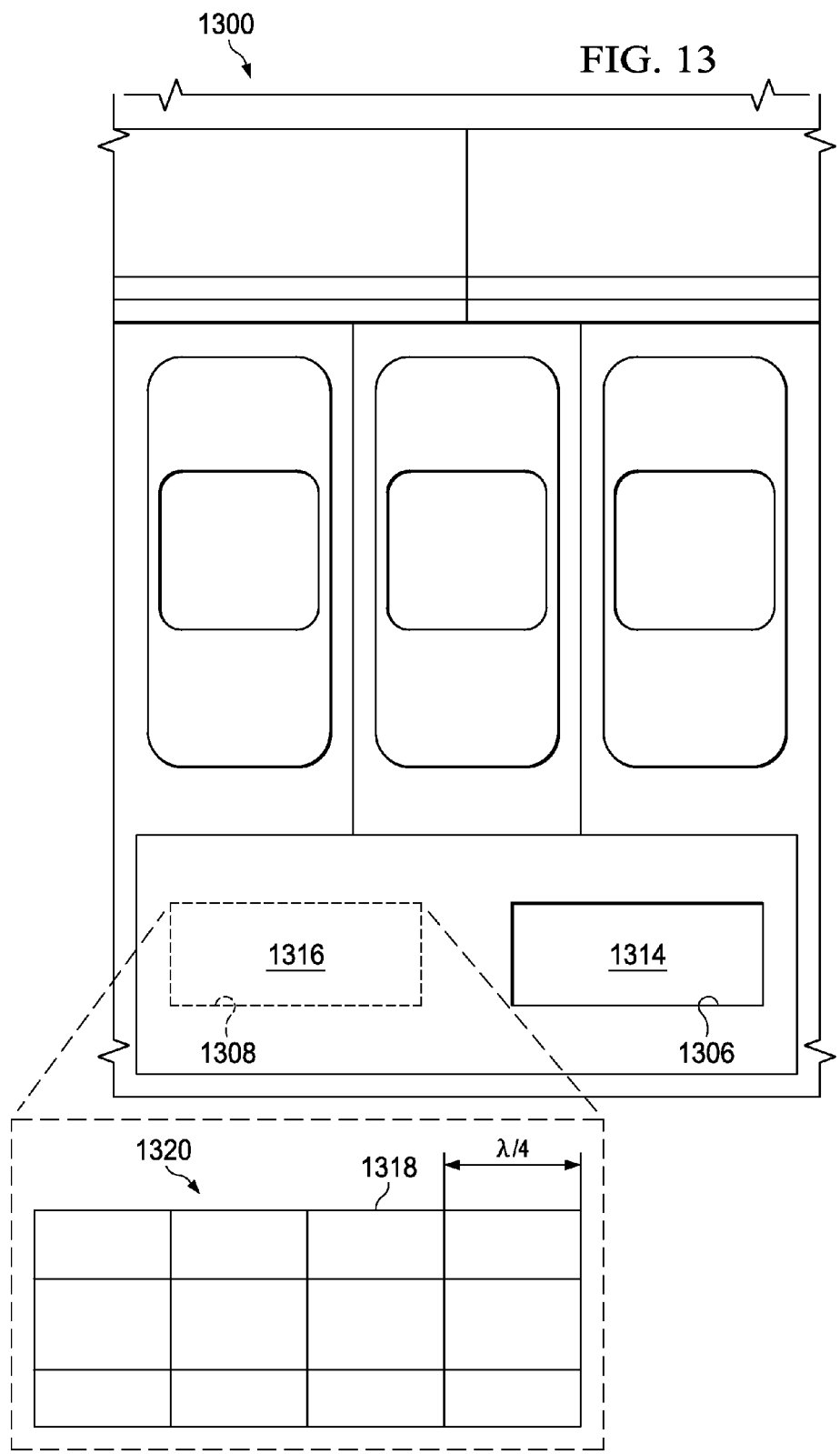
FIG. 13 is an illustration of components used in walls to form boundaries in accordance with an illustrative embodiment.

Turning now to FIG. 13, an illustration of components used in walls to form boundaries is depicted in accordance with an illustrative embodiment. In this depicted example, wall 1300 is a wall in an aircraft in which openings 1306 and 1308 are present.

These openings are covered with components in the form of return air grills 1314 and 1316, respectively. These air grills may be comprised of grates such as grate 1318. Grate 1318 is an example of an implementation for grate 310 shown in block form in FIG. 3.

As depicted, grate 1318 has a spacing of conductive elements 1320 that may be used to reflect radio frequency signals. For example, the spacing of conductive elements 1320 in grate 1318 may be such that a distance between the conductive elements is a quarter wavelength of the wireless signals that are to be reflected. In this manner, the return air grills may be made reflective to those wireless signals.

Turning now to FIG. 14, another illustration of components used to form boundaries is depicted in accordance with an illustrative embodiment. In this depicted example, panel 1400 and panel 1402 are examples of panels that may be present in the wall, ceiling, or other locations in the cabin of an aircraft. Panel 1400 and panel 1402 are examples of an implementation for panel 300 shown in block form in FIG. 3.

In these illustrative examples, gap 1403 is present between panel 1400 and panel 1402. As depicted, gasket 1404 may be placed in gap 1403. Gasket 1404 may be placed in gap 1403 to reduce or prevent radio frequency signals from entering the gaps and coupling between panel 1400 and panel 1402. Gasket 1404 may take various forms such as a flexible filler, treated tape, and other suitable types of components that may be used to cover gap 1403.

Additionally, end 1406 by wall 1408 may be treated with resistive coating 1410. Resistive coating 1410 on end 1406 may reduce diffraction or entry of radio frequency signals occurring in area 1412 from entering area 1414.

With reference now to FIG. 15, an illustration of a flowchart of a process for designing an aircraft is depicted in accordance with an illustrative embodiment. The process illustrated in FIG. 15 may be used to design an interior of an aircraft. In particular, this process may be implemented using boundary designer 102 to generate boundary design 106 having number of boundaries 155 for the interior of fuselage 128. In particular, this process may be used to obtain desired types of wireless signal propagation 124.

The process begins by identifying a configuration for wireless networks in an aircraft (operation 1500). The process then selects a number of boundaries for the wireless networks that provide a desired propagation of wireless signals for the wireless networks (operation 1502). The process then selects a configuration for a number of components from designs in a components database and a number of materials for the number of components from a materials database to form the number of boundaries for the wireless networks (operation 1504) with the process terminating thereafter.

Figure 16:
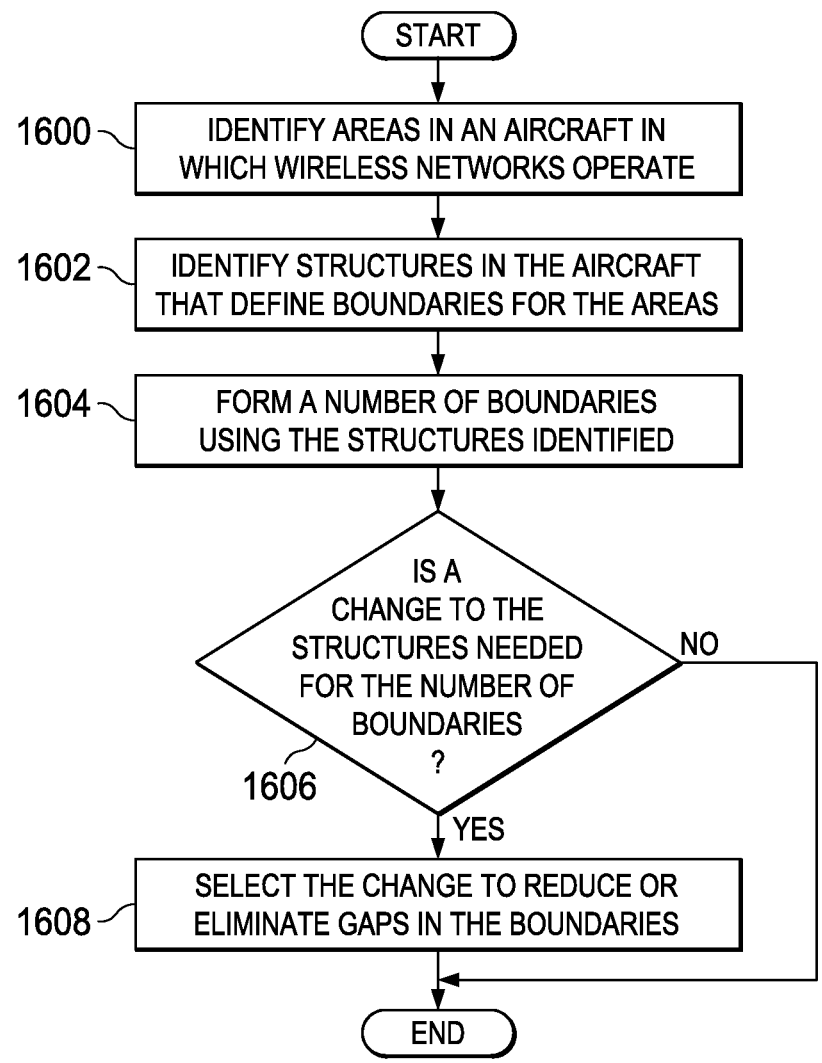
FIG. 16 is an illustration of a flowchart of a process for selecting a number of boundaries for an aircraft in accordance with an illustrative embodiment.

Turning now to FIG. 16, an illustration of a flowchart of a process for selecting a number of boundaries for an aircraft is depicted in accordance with an illustrative embodiment. The process illustrated in FIG. 16 may be implemented by boundary designer 102 in FIG. 1. Further, this process is an example of one implementation for operation 1502 in FIG. 15.

The process begins by identifying areas in an aircraft in which wireless networks operate (operation 1600). The process then identifies structures in the aircraft that define boundaries for the areas (operation 1602). Next, the process forms a number of boundaries using the structures identified (operation 1604).

A determination is made as to whether a change to the structures is needed for the number of boundaries (operation 1606). In operation 1606, the process looks to determine whether undesired gaps are present in the number of boundaries generated using the existing structures in the aircraft design.

If a change to the structure is needed, the change is selected to reduce or eliminate gaps in the boundaries (operation 1608) with the process terminating thereafter. This change may be the addition of a structure, the movement of a structure, the reconfiguration of a structure, or some other suitable change. The extent to which changes may be made may depend on constraints in designing the aircraft. If a change to the structures is not needed for the number of boundaries in operation 1606, the process also terminates.

Figure 17:
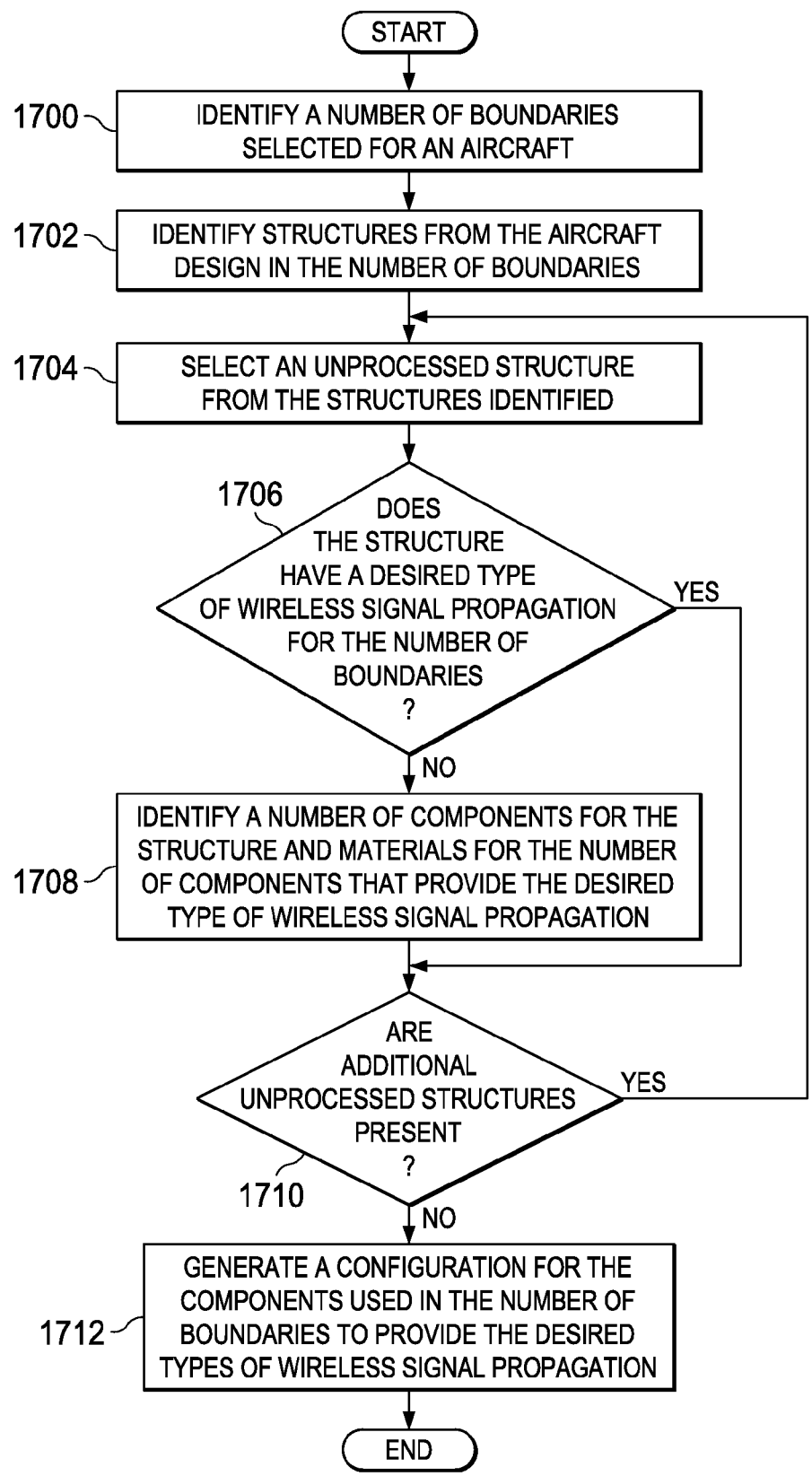
FIG. 17 is an illustration of a flowchart of a process for configuring components from designs in a components database in accordance with an illustrative embodiment.

With reference now to FIG. 17, an illustration of a flowchart of a process for configuring components from designs in a components database is depicted in accordance with an illustrative embodiment. The process illustrated in FIG. 17 may be implemented in boundary designer 102 in FIG. 1 to generate boundary design 106. In particular, this process may be used to generate configuration 156 for components 118 in boundary design 106. Additionally, this process is an example of an implementation of operation 1504 in FIG. 15.

The process begins by identifying a number of boundaries selected for an aircraft (operation 1700). Thereafter, the process identifies structures from the aircraft design in the number of boundaries (operation 1702). The process then selects an unprocessed structure from the structures identified (operation 1704). A determination is made as to whether the structure has a desired type of wireless signal propagation for the number of boundaries (operation 1706).

If the structure has a desired type of wireless signal propagation, the process proceeds to operation 1710 as described above. If the structure does not have a desired type of wireless signal propagation, the process identifies a number of components for the structure and materials for the number of components that provide the desired type of wireless signal propagation (operation 1708). In operation 1708, the number of components identified may be components already existing in the structure. Changes to components already existing in the structure may be made. For example, different materials may be selected to provide a desired type of wireless signal propagation.

In some illustrative examples, the number of components also may include new components to be added in addition to existing components in the structure. For example, a shroud may be added to a stowage bin or a passenger seat. In another example, a gasket may be added between panels in a wall.

The process then determines whether additional unprocessed structures are present (operation 1710). If additional unprocessed structures are present, the process returns to operation 1704. Otherwise, the process generates a configuration for the components used in the number of boundaries to provide the desired types of wireless signal propagation (operation 1712) with the process terminating thereafter.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 18:
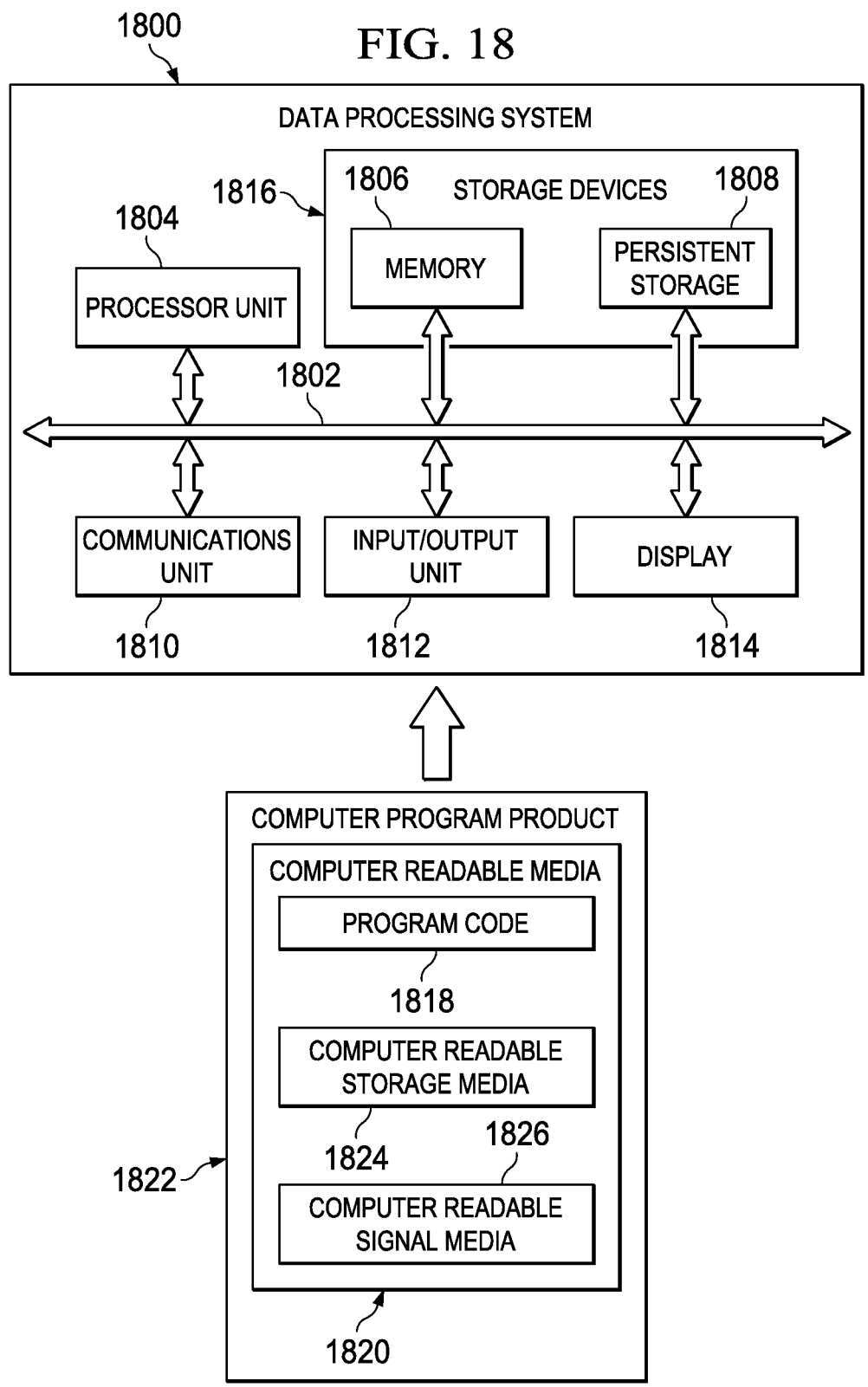
FIG. 18 is an illustration of a data processing system in accordance with an illustrative embodiment.

Turning now to FIG. 18, an illustration of a data processing system is depicted in accordance with an illustrative embodiment. Data processing system 1800 may be used to implement computer system 110 in FIG. 1. In this illustrative example, data processing system 1800 includes communications framework 1802, which provides communications between processor unit 1804, memory 1806, persistent storage 1808, communications unit 1810, input/output (I/O) unit 1812, and display 1814. In these examples, communications framework 1802 may be a bus system.

Processor unit 1804 serves to execute instructions for software that may be loaded into memory 1806. Processor unit 1804 may be a number of processors, a multi-processor core, or some other type of processor, depending on the particular implementation. "A number of", as used herein with reference to an item, means one or more items. Further, processor unit 1804 may be implemented using a number of heterogeneous processor systems in which a main processor is present with secondary processors on a single chip. As another illustrative example, processor unit 1804 may be a symmetric multi-processor system containing multiple processors of the same type.

Memory 1806 and persistent storage 1808 are examples of storage devices 1816. A storage device is any piece of hardware that is capable of storing information, such as, for example, without limitation, data, program code in functional form, and/or other suitable information either on a temporary basis and/or a permanent basis. Storage devices 1816 may also be referred to as computer readable storage devices in these examples. Memory 1806, in these examples, may be, for example, a random access memory or any other suitable volatile or non-volatile storage device. Persistent storage 1808 may take various forms, depending on the particular implementation.

For example, persistent storage 1808 may contain one or more components or devices. For example, persistent storage 1808 may be a hard drive, a flash memory, a rewritable optical disk, a rewritable magnetic tape, or some combination of the above. The media used by persistent storage 1808 also may be removable. For example, a removable hard drive may be used for persistent storage 1808.

Communications unit 1810, in these examples, provides for communications with other data processing systems or devices. In these examples, communications unit 1810 is a network interface card. Communications unit 1810 may provide communications through the use of either or both physical and wireless communications links.

Input/output unit 1812 allows for input and output of data with other devices that may be connected to data processing system 1800. For example, input/output unit 1812 may provide a connection for user input through a keyboard, a mouse, and/or some other suitable input device. Further, input/output unit 1812 may send output to a printer. Display 1814 provides a mechanism to display information to a user.

Instructions for the operating system, applications, and/or programs may be located in storage devices 1816, which are in communication with processor unit 1804 through communications framework 1802. In these illustrative examples, the instructions are in a functional form on persistent storage 1808. These instructions may be loaded into memory 1806 for execution by processor unit 1804. The processes of the different embodiments may be performed by processor unit 1804 using computer implemented instructions, which may be located in a memory, such as memory 1806.

These instructions are referred to as program code, computer usable program code, or computer readable program code that may be read and executed by a processor in processor unit 1804. The program code in the different embodiments may be embodied on different physical or computer readable storage media, such as memory 1806 or persistent storage 1808.

Program code 1818 is located in a functional form on computer readable media 1820 that is selectively removable and may be loaded onto or transferred to data processing system 1800 for execution by processor unit 1804. Program code 1818 and computer readable media 1820 form computer program product 1822 in these examples. In one example, computer readable media 1820 may be computer readable storage media 1824 or computer readable signal media 1826. Computer readable storage media 1824 may include, for example, an optical or magnetic disk that is inserted or placed into a drive or other device that is part of persistent storage 1808 for transfer onto a storage device, such as a hard drive, that is part of persistent storage 1808. Computer readable storage media 1824 also may take the form of a persistent storage, such as a hard drive, a thumb drive, or a flash memory, that is connected to data processing system 1800. In some instances, computer readable storage media 1824 may not be removable from data processing system 1800. In these examples, computer readable storage media 1824 is a physical or tangible storage device used to store program code 1818 rather than a medium that propagates or transmits program code 1818. Computer readable storage media 1824 is also referred to as a computer readable tangible storage device or a computer readable physical storage device. In other words, computer readable storage media 1824 is a media that can be touched by a person.

Alternatively, program code 1818 may be transferred to data processing system 1800 using computer readable signal media 1826. Computer readable signal media 1826 may be, for example, a propagated data signal containing program code 1818. For example, computer readable signal media 1826 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1818 may be downloaded over a network to persistent storage 1808 from another device or data processing system through computer readable signal media 1826 for use within data processing system 1800. For instance, program code stored in a computer readable storage medium in a server data processing system may be downloaded over a network from the server to data processing system 1800. The data processing system providing program code 1818 may be a server computer, a client computer, or some other device capable of storing and transmitting program code 1818.

The different components illustrated for data processing system 1800 are not meant to provide architectural limitations to the manner in which different embodiments may be implemented. The different illustrative embodiments may be implemented in a data processing system including components in addition to or in place of those illustrated for data processing system 1800. Other components shown in FIG. 18 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 1804 may take the form of a hardware unit that has circuits that are manufactured or configured for a particular use. This type of hardware may perform operations without needing program code to be loaded into a memory from a storage device to be configured to perform the operations.

For example, when processor unit 1804 takes the form of a hardware unit, processor unit 1804 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 1818 may be omitted because the processes for the different embodiments are implemented in a hardware unit.

In still another illustrative example, processor unit 1804 may be implemented using a combination of processors found in computers and hardware units. Processor unit 1804 may have a number of hardware units and a number of processors that are configured to run program code 1818. With this depicted example, some of the processes may be implemented in the number of hardware units, while other processes may be implemented in the number of processors.

In another example, a bus system may be used to implement communications framework 1802 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of more devices that transmit data, receive data, or transmit and receive data. A communications unit may be, for example, a modem or a network adapter, two network adapters, or some combination thereof. Further, a memory may be, for example, memory 1806, or a cache, such as found in an interface and memory controller hub that may be present in communications framework 1802.

Figure 19:
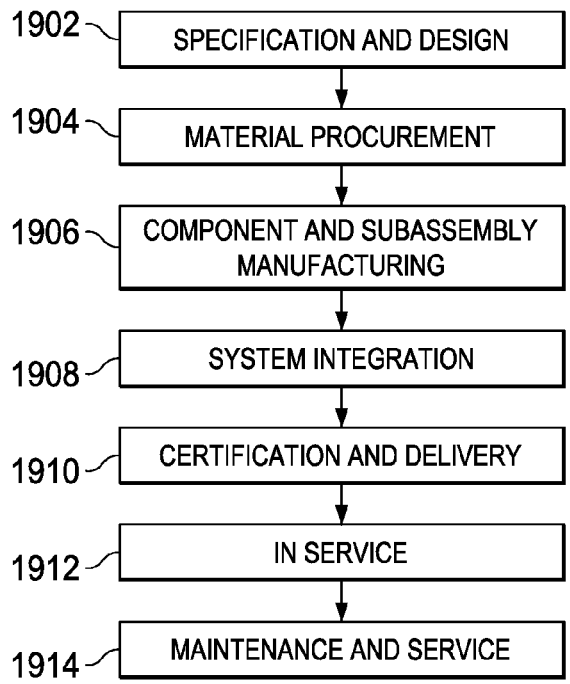
FIG. 19 is an illustration of an aircraft manufacturing and service method in accordance with an illustrative embodiment.
Figure 20:
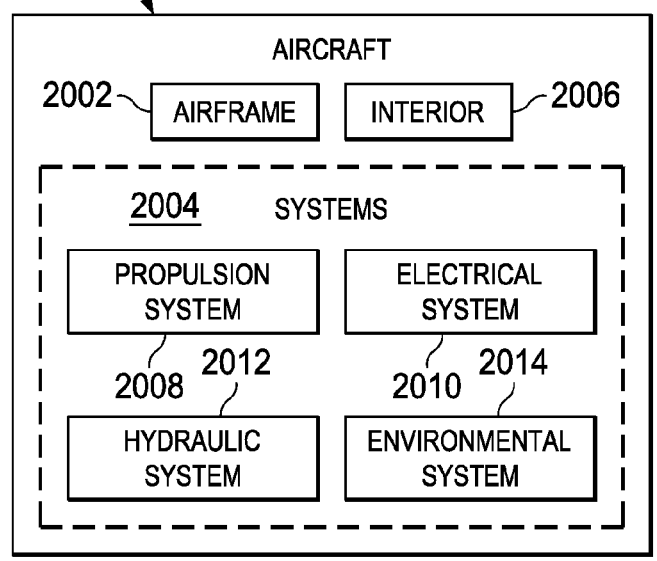
FIG. 20 is an illustration of an aircraft in which an illustrative embodiment may be implemented.

Illustrative embodiments of the disclosure may be described in the context of aircraft manufacturing and service method 1900 as shown in FIG. 19 and aircraft 2000 as shown in FIG. 20. Turning first to FIG. 19, an illustration of an aircraft manufacturing and service method is depicted in accordance with an illustrative embodiment. During pre-production, aircraft manufacturing and service method 1900 may include specification and design 1902 of aircraft 2000 in FIG. 20 and material procurement 1904.

During production, component and subassembly manufacturing 1906 and system integration 1908 of aircraft 2000 in FIG. 20 takes place. Thereafter, aircraft 2000 in FIG. 20 may go through certification and delivery 1910 in order to be placed in service 1912. While in service 1912 by a customer, aircraft 2000 in FIG. 20 is scheduled for routine maintenance and service 1914, which may include modification, reconfiguration, refurbishment, and other maintenance or service.

Each of the processes of aircraft manufacturing and service method 1900 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 20, an illustration of an aircraft is depicted in which an illustrative embodiment may be implemented. In this example, aircraft 2000 is produced by aircraft manufacturing and service method 1900 in FIG. 19 and may include airframe 2002 with plurality of systems 2004 and interior 2006. Examples of systems 2004 include one or more of propulsion system 2008, electrical system 2010, hydraulic system 2012, and environmental system 2014. Any number of other systems may be included. Although an aerospace example is shown, different illustrative embodiments may be applied to other industries, such as the automotive industry.

Apparatus and methods embodied herein may be employed during at least one of the stages of aircraft manufacturing and service method 1900 in FIG. 19.

In one illustrative example, boundary designer 102 may be used to generate a boundary design for aircraft 2000 during specification and design 1902. Further, components may be manufactured from the boundary design for aircraft 2000 during components and subassembly manufacturing 1906. Further, components or subassemblies produced in component and subassembly manufacturing 1906 in FIG. 19 may be fabricated or manufactured in a manner similar to components or subassemblies produced while aircraft 2000 is in service 1912 in FIG. 19.

As yet another example, one or more apparatus embodiments, method embodiments, or a combination thereof may be utilized during production stages, such as component and subassembly manufacturing 1906 and system integration 1908 in FIG. 19. For example, configurations for components may be used to form boundaries during component and subassembly manufacturing 1906 and system integration 1908 in FIG. 19.

In yet another illustrative example, one or more apparatus embodiments, method embodiments, or a combination thereof may be utilized while aircraft 2000 is in service 1912 and/or during maintenance and service 1914 in FIG. 19. For example, boundary design 106 may be created or updated to perform upgrades to aircraft 2000 during maintenance and service 1914. The use of a number of the different illustrative embodiments may substantially expedite the assembly of and/or reduce the cost of aircraft 2000.

Thus, with one or more illustrative embodiments, interiors of the aircraft may be optimized to provide desired levels of performance for wireless networks. In other words, wireless networks may have higher data rates, lower power consumption, higher spectrums, increased reliability, and other benefits from the use of boundaries to provide desired types of wireless signal propagation.

In addition, the analysis and design of the interiors of aircraft may be more simple and may be less time consuming when using an illustrative embodiment. With boundary designers, such as boundary designer 102, areas that are undesirable for simulation or wireless signal propagation may be isolated from areas in which wireless signal propagation is desired. In this manner, a more accurate analysis may be made of wireless signal propagation within the aircraft. With an increased accuracy and analysis, improved networks as compared to those with currently used analysis in simulation systems may be designed.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aircraft design system comprising:
a memory storing software comprising: a components database, a materials database, and a boundary designer;
a processor unit configured to execute the software stored in the memory;
the components database having designs for components configured for use in an aircraft;
the materials database having materials selected for desired types of wireless signal propagation;
the boundary designer configured to
identify a configuration for wireless networks in the aircraft;
select a number of boundaries for the wireless networks that provide a desired propagation of wireless signals for the wireless networks; and
select a configuration for a number of the components from the designs in the components database and select a number of materials for the number of the components to form the number of boundaries for the wireless networks improving wireless performance and integration; and
wherein the desired propagation is provided by the number of materials and the number of components.

2. The aircraft design system of claim 1, wherein the boundary designer is further configured to select the number of boundaries to configure at least one of a desired separation of the wireless signals and a desired optimization of the wireless signals between the wireless networks, and a desired optimization of the wireless signals within a wireless network.

3. The aircraft design system of claim 1, wherein the number of boundaries forms areas for the wireless networks in which the desired propagation of the wireless signals is within the areas.

4. The aircraft design system of claim 1, wherein the boundary designer is configured to receive an aircraft design for the aircraft in which the aircraft design includes the wireless networks and selects the number of boundaries for the wireless networks that provide the desired propagation of the wireless signals for the wireless networks using the aircraft design.

5. The aircraft design system of claim 1, wherein a component in the components database is selected from one of a panel, an insulation blanket, a gasket, a shroud, a carpet, a grate, a cage, a radio frequency aperture, an appliqué, a curtain, a volume absorber, a grid, a fabric, a coating, and a plate.

6. The aircraft design system of claim 1, wherein the components are configured for use in structures selected from at least one of a cabin wall, a bulkhead, a closet, a lavatory, a ceiling, a floor, a partition, a stowage bin, a passenger seat, and a galley.

7. The aircraft design system of claim 1, wherein a material in the materials database has a type of propagation selected from reflective, transmissive, absorptive, selectively reflective, selectively transmissive, and selectively absorptive.

8. The aircraft design system of claim 1, wherein a material in the materials database is selected from one of a conductive material, a resistive material, and a neutral material.

9. The aircraft design system of claim 1, wherein a wireless network in the wireless networks is selected from one of a passenger cabin network, an avionics network, a flight deck network, and a cargo bay network.

10. A method for designing an aircraft, the method comprising:
identifying a configuration for wireless networks in the aircraft;
selecting a number of boundaries for the wireless networks that provide a propagation of wireless signals for the wireless networks; and
selecting a configuration for a number of components from designs in a components database and a number of materials for the number of the components from a materials database to form the number of boundaries for the wireless networks;
wherein the desired propagation is provided by the number of materials and the number of components.

11. The method of claim 10 further comprising:
selecting the number of boundaries for the wireless networks to configure at least one of a desired separation of the wireless signals and a desired optimization of the wireless signals between the wireless networks, and a desired optimization of the wireless signals within a wireless network.

12. The method of claim 10, wherein the number of boundaries forms areas for the wireless networks in which the desired propagation of the wireless signals is within an area.

13. The method of claim 10 further comprising:
receiving an aircraft design for the aircraft in which the aircraft design includes the wireless networks, wherein selecting the number of boundaries for the wireless networks that provide the desired propagation of the wireless signals for the wireless networks comprises:
selecting the number of boundaries for the wireless networks that provide the desired propagation of the wireless signals for the wireless networks using the aircraft design.

14. The method of claim 10, wherein a component in the components database is selected from one of a panel, an insulation blanket, a gasket, a shroud, a carpet, a grate, a cage, a radio frequency aperture, an appliqué, a curtain, a volume absorber, a grid, a fabric, a coating, and a plate.

15. The method of claim 10, wherein a number of components are configured for use in structures selected from at least one of a cabin wall, a bulkhead, a closet, a lavatory, a ceiling, a floor, a partition, a stowage bin, a passenger seat, and a galley.

16. The method of claim 10, wherein a material in the materials database has a type of propagation selected from reflective, absorptive, transmissive, selectively reflective, selectively absorptive, and selectively transmissive.

17. The method of claim 10, wherein a material in the materials database is selected from one of a conductive material, a resistive material, and a neutral material.

18. An aircraft wireless network system comprising:
a number of components within an aircraft in which the number of components has a configuration and is comprised of a number of materials selected to form a number of boundaries within the aircraft that provide a desired propagation of wireless signals between devices in wireless networks in the aircraft;
wherein the configuration for the number of components is selected from designs and the number of materials to form the number of boundaries for the wireless networks, the designs from a components database and the number of materials for the number of the components from a materials database; and
wherein the desired propagation is provided by the number of materials and the number of components.

19. The aircraft wireless network system of claim 18, wherein a component in the number of components is selected from one of a panel, an insulation blanket, a gasket, a shroud, a carpet, a grate, a cage, a radio frequency aperture, an appliqué, a curtain, a volume absorber, a grid, a fabric, a coating, and a plate.

20. The aircraft wireless network system claim 18, wherein the number of components are configured for use in structures in the aircraft selected from at least one of a cabin wall, a bulkhead, a closet, a lavatory, a ceiling, a floor, a partition, a stowage bin, a passenger seat, and a galley.

* * * * *